(12) United States Patent
Oikawa et al.

(10) Patent No.: US 8,143,708 B2
(45) Date of Patent: Mar. 27, 2012

(54) SEMICONDUCTOR DEVICE AND METHOD FOR MANUFACTURING THE SAME

(75) Inventors: Yoshiaki Oikawa, Tochigi (JP); Shingo Eguchi, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 255 days.

(21) Appl. No.: 12/564,637

(22) Filed: Sep. 22, 2009

(65) Prior Publication Data

US 2010/0072611 A1    Mar. 25, 2010

(30) Foreign Application Priority Data

Sep. 25, 2008 (JP) ................................. 2008-246052

(51) Int. Cl.
*H01L 23/60* (2006.01)
*H01L 23/02* (2006.01)
(52) U.S. Cl. .................. 257/678; 257/687; 257/709
(58) Field of Classification Search .......... 257/678–711, 257/E23.191, E23.116
See application file for complete search history.

(56) References Cited

U.S. PATENT DOCUMENTS

| | | | |
|---|---|---|---|
| 7,504,317 B2 | 3/2009 | Aoki et al. | |
| 7,510,950 B2 | 3/2009 | Tsurume et al. | |
| 7,712,676 B2 * | 5/2010 | Yukawa et al. | 235/492 |
| 7,736,958 B2 * | 6/2010 | Dozen et al. | 438/155 |
| 7,994,617 B2 * | 8/2011 | Arai et al. | 257/679 |
| 2007/0077691 A1 | 4/2007 | Watanabe | |
| 2007/0181875 A1 | 8/2007 | Yamazaki et al. | |
| 2008/0044940 A1 | 2/2008 | Watanabe et al. | |
| 2008/0224941 A1 | 9/2008 | Sugiyama et al. | |
| 2008/0242005 A1 | 10/2008 | Dozen et al. | |
| 2008/0303140 A1 | 12/2008 | Ohtani et al. | |
| 2009/0057875 A1 | 3/2009 | Aoki et al. | |
| 2009/0085182 A1 | 4/2009 | Yamazaki et al. | |
| 2009/0305467 A1 * | 12/2009 | Goto et al. | 438/125 |
| 2010/0072583 A1 * | 3/2010 | Oikawa et al. | 257/659 |

FOREIGN PATENT DOCUMENTS

EP    1 818 860 A2    8/2007

(Continued)

OTHER PUBLICATIONS

International Search Report re application No. PCT/JP2009/065543, dated Dec. 1, 2009.
Written Opinion re application No. PCT/JP2009/065543, dated Dec. 1, 2009.

*Primary Examiner* — Cuong Q Nguyen
(74) *Attorney, Agent, or Firm* — Husch Blackwell LLP

(57) ABSTRACT

An object is to provide a thin and small semiconductor device that has high reliability and high resistance to external stress and electrostatic discharge. Another object is to manufacture a semiconductor device with high yield while shape defects and defective characteristics which are caused by external stress or electrostatic discharge are prevented in the manufacturing process. A conductive shield covering a semiconductor integrated circuit prevents electrostatic breakdown (malfunction of the circuit or damage to a semiconductor element) of the semiconductor integrated circuit due to electrostatic discharge. By providing an antenna on the external side of the conductive shield, a sufficient communication capability is secured. With the use of a pair of insulators which sandwich the semiconductor integrated circuit, a thin and small semiconductor device that has resistance properties and high reliability can be provided. Further, shape defects and defective characteristics which are caused by external stress or electrostatic discharge are prevented in the manufacturing process, so that a semiconductor device can be manufactured with high yield.

13 Claims, 19 Drawing Sheets

FOREIGN PATENT DOCUMENTS

| | | |
|---|---|---|
| JP | 9-286188 | 11/1997 |
| JP | 2002-366918 | 12/2002 |
| JP | 2003-228695 | 8/2003 |
| JP | 2005-284352 | 10/2005 |
| JP | 2007-123859 | 5/2007 |
| JP | 2007-241999 | 9/2007 |
| WO | WO 2007/043285 A1 | 4/2007 |

* cited by examiner

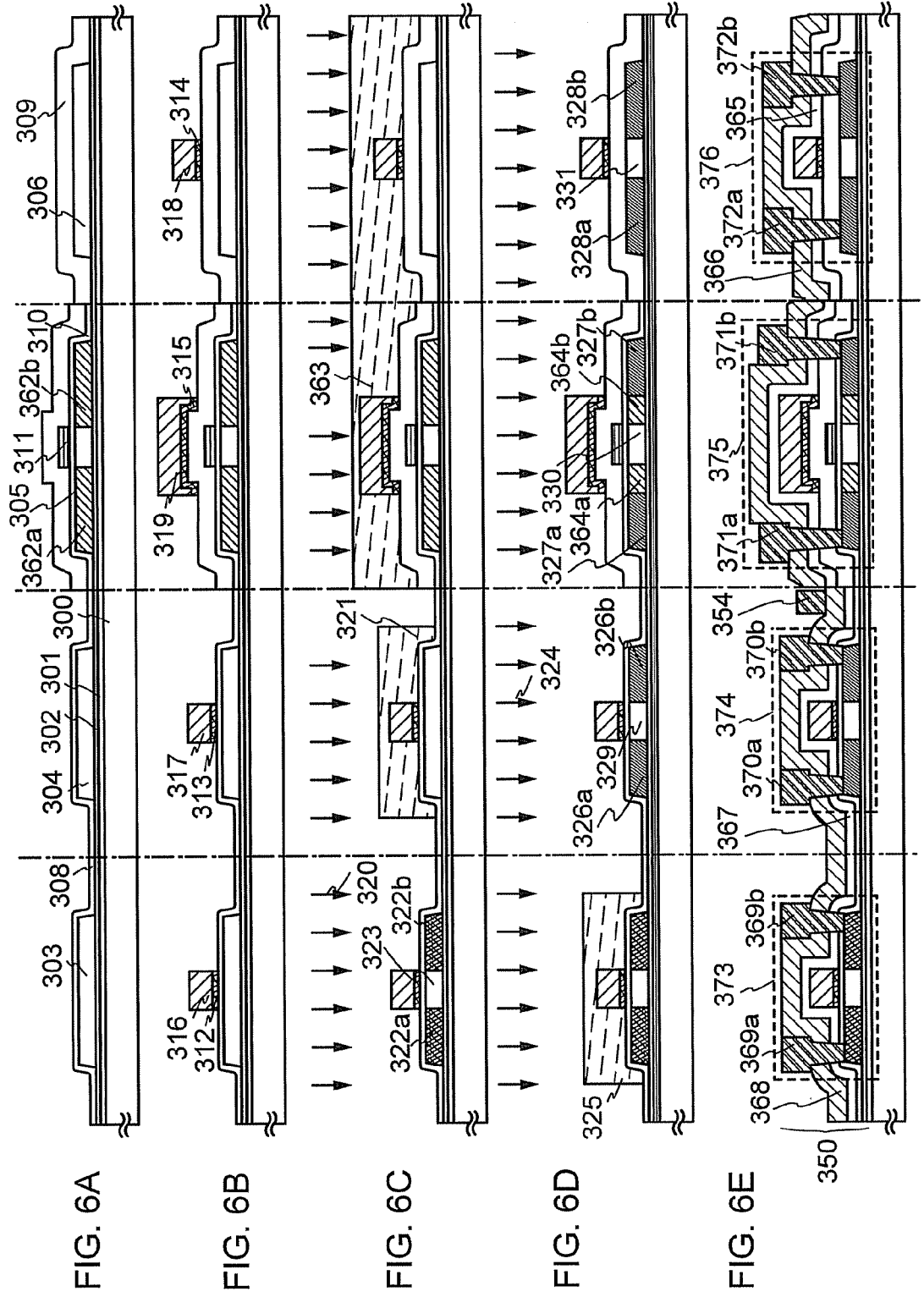

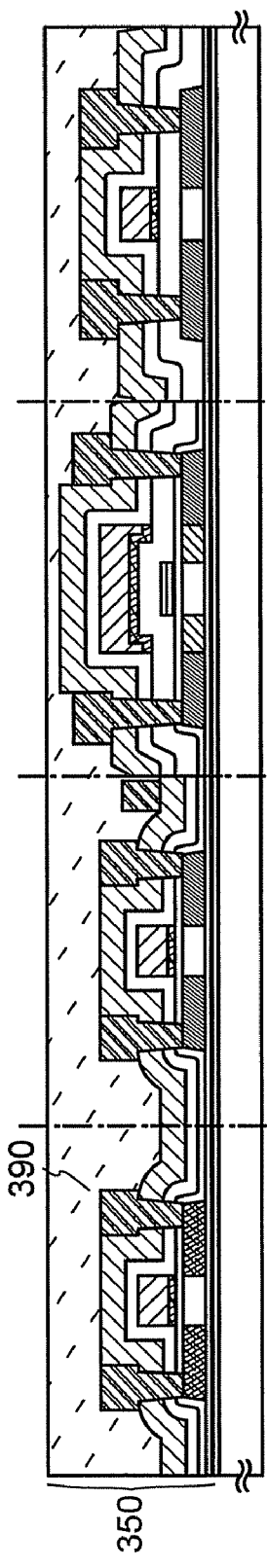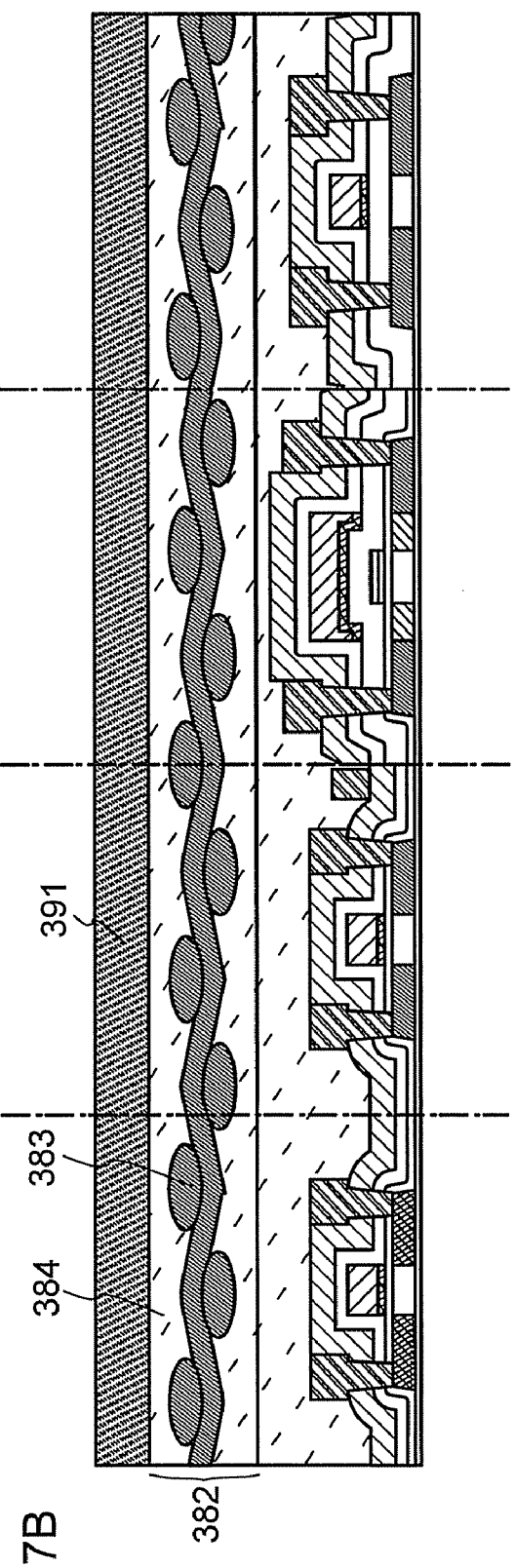
FIG. 7A
FIG. 7B

SEMICONDUCTOR DEVICE AND METHOD FOR MANUFACTURING THE SAME

TECHNICAL FIELD

The present invention relates to a semiconductor device and a manufacturing method thereof.

BACKGROUND ART

In a semiconductor device that sends and receives data through an antenna with wireless communication (also referred to as a non-contact signal processor, a semiconductor integrated circuit chip, or an IC chip), an element is damaged by electrostatic discharge (ESD) from the outside (electrostatic breakdown occurs) in some cases. This problem is serious because it leads to reduction in reliability and productivity from the time of manufacturing and inspecting the semiconductor device to the time of using the semiconductor device as a product, and countermeasures against such a problem have been reported (e.g., see Patent Document 1).

Patent Document 1 discloses an example in which electrostatic breakdown is prevented by using a conductive polymer layer for a substrate and an adhesive in the semiconductor device.

REFERENCE

Patent Document 1: Japanese Published Patent Application No. 2007-241999

DISCLOSURE OF INVENTION

With expansion of the semiconductor device market, there are a variety of demands for shapes and characteristics to be required. In particular, as for the shape, reduction in size and thickness has been strongly required. Moreover, higher resistance to the above-described electrostatic breakdown or increase in strength against external stress has been requested. Further, it is important for the semiconductor device that the reliability is improved and a wireless communication function which is an original function is equivalent to or better than that of a conventional device.

In view of the foregoing problem, an object of one embodiment of the present invention is to provide a small and thin semiconductor device in which resistance to electrostatic breakdown or strength against external stress is increased without impairment of a wireless communication function. Another object is to manufacture a semiconductor device with high yield while defects in the shape and functional operation which are caused by electrostatic breakdown are prevented in a manufacturing process. Further, another object is to manufacture a semiconductor device at low cost and with high productivity.

A semiconductor device which is one embodiment of the present invention includes insulators that sandwich a semiconductor integrated circuit from above and below the semiconductor integrated circuit; and a conductive shield provided so as to cover the external side of the insulators. Moreover, an antenna that is electrically connected to a terminal extended from the semiconductor integrated circuit is provided over the conductive shield. The semiconductor device which is one embodiment of the present invention is a non-contact signal processor having a function of sending and receiving a signal to/from an external device with wireless communication. Accordingly, the conductive shield does not interfere with electromagnetic waves that should be sent and received through the antenna electrically connected to the semiconductor integrated circuit, and blocks static electricity applied from the outside to the semiconductor integrated circuit in the semiconductor device.

A semiconductor device according to one embodiment of the present invention includes a semiconductor integrated circuit; insulators provided so as to sandwich the semiconductor integrated circuit from above and below the semiconductor integrated circuit; a conductive shield provided so as to cover a surface of the insulators; and an antenna which is provided over the conductive shield and electrically connected to a terminal extended from the semiconductor integrated circuit.

Since the conductive shield diffuses static electricity applied by electrostatic discharge to let it go or prevents local electric charge (localization of electric charge) (i.e., prevents local potential difference from occurring over the semiconductor device), electrostatic breakdown of the semiconductor integrated circuit can be prevented. The conductive shield is formed so as to cover the top surface, bottom surface, and side surface (a cross section generated by cutting, also referred to as a cut surface) of the semiconductor integrated circuit with the insulator therebetween.

The antenna provided over the conductive shield and the terminal extended from the semiconductor integrated circuit can be electrically connected to each other through a contact hole provided in the insulator and the conductive shield.

Alternatively, the antenna provided over the conductive shield and the terminal extended from the semiconductor integrated circuit may be electrically connected to each other through a region to which conductivity is imparted, which is obtained in such a manner that a contact hole is provided in the conductive shield, and part of the insulator exposed at the contact hole is impregnated with a conductive material. Further, except a region where the antenna and the semiconductor integrated circuit are electrically connected to each other, an insulating layer may be provided between the conductive shield and the antenna so that the conductive shield and the antenna are not in direct contact with each other.

The conductive shield should have conductivity, and a conductive layer formed using a conductive material can be used.

A material and the thickness of such a conductive shield are determined so that the conductive shield does not interfere with electromagnetic waves that should be sent and received through the antenna electrically connected to the semiconductor integrated circuit covered with the conductive shield and block static electricity. Accordingly, a semiconductor device that is resistant to electrostatic breakdown can be provided without impairment of a wireless communication function.

The insulators provided so as to sandwich the semiconductor integrated circuit from above and below the semiconductor integrated circuit also function as impact resistance layers against physical force applied to the semiconductor device from the outside (also referred to as external stress) and as impact diffusion layers for diffusing such force. The provision of the insulator can reduce force locally applied to the semiconductor device; thus, damage, defects in the functional operation, and the like of the semiconductor device due to external stress can be prevented.

The semiconductor integrated circuit included in the semiconductor device may be formed in such a manner that a semiconductor integrated circuit is formed over a substrate, one surface thereof is bonded to an insulator to serve as another support substrate, and then, the semiconductor integrated circuit is separated from the substrate. In this case, a surface of the semiconductor integrated circuit and the substrate generated by separating the semiconductor integrated circuit from the substrate is referred to as a separation surface.

Alternatively, the semiconductor integrated circuit included in the semiconductor device may be formed directly over a flexible substrate. Examples of the flexible substrate are film-shaped resin substrates made of a polyethylene terephthalate (PET) resin, a polyethylene naphthalate (PEN) resin, or the like. It is needless to say that the flexible substrate is not limited thereto.

Note that in this specification, the term "transfer" (also referred to as transpose) indicates that a semiconductor integrated circuit formed over a substrate is separated from the substrate and moved to another substrate. In other words, the term "transfer" indicates that the position where the semiconductor integrated circuit is provided is moved to another substrate.

The insulator to serve as a support substrate may be bonded to the semiconductor integrated circuit with a bonding layer. In that case, the bonding layer is provided between the semiconductor integrated circuit and the insulator. Alternatively, the insulator and the semiconductor integrated circuit may be directly bonded by heat treatment and pressure treatment.

For the conductive shield, a metal film, a metal nitride film, a metal oxide film, or the like; or a stack of these films can be used. The thickness of the conductive shield is preferably 1 µm or less in consideration of the balance between the wireless communication function and the capability to block static electricity.

The conductive shield may be formed using, for example, an element selected from titanium, molybdenum, tungsten, aluminum, copper, silver, gold, nickel, platinum, palladium, iridium, rhodium, tantalum, cadmium, zinc, iron, silicon, germanium, zirconium, or barium; or an alloy material, a compound material, a nitride material, or an oxide material which contains any of the above elements as a main component.

As the nitride material, tantalum nitride, titanium nitride, or the like can be used.

As the oxide material, indium tin oxide (ITO), indium tin oxide containing silicon oxide (ITSO), organoindium, organotin, zinc oxide (ZnO), or the like can be used. Alternatively, indium zinc oxide (IZO) containing zinc oxide, zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

Alternatively, a semiconductor film having conductivity, which is obtained by adding an impurity element or the like to a semiconductor, or the like can be used. For example, a polycrystalline silicon film doped with an impurity element such as phosphorus can be used.

Further, for the conductive shield, a conductive macromolecule (also referred to as a conductive polymer) may be used. As the conductive macromolecule, a so-called π-electron conjugated conductive polymer can be used. For example, polyaniline and/or a derivative thereof, polypyrrole and/or a derivative thereof, polythiophene and/or a derivative thereof, and a copolymer of two or more kinds of those materials can be used.

Specific examples of a conjugated conductive polymer are polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly (3-carboxypyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(-methylaniline), poly(2-octylaniline), poly (-isobutylaniline), poly(3-isobutylaniline), poly(-anilinesulfonic acid), and poly(3-anilinesulfonic acid).

The conductive shield containing the conductive macromolecule may contain an organic resin or a dopant (e.g., a halogen, a Lewis acid, an inorganic acid, an organic acid, transition metal halide, an organic cyano compound, or a nonionic surfactant).

The conductive shield can be formed by a dry process such as a sputtering method, a plasma CVD method, or an evaporation method; or a wet process such as a coating method, a printing method, or a droplet discharging method (an inkjet method).

A protective layer may be formed over the conductive shield so that the antenna provided over the conductive shield and the conductive shield are not in contact with each other. For example, a titanium film may be formed as the conductive shield, and a titanium oxide film may be stacked over the titanium film as the protective layer. By the provision of the protective layer, even when the conductive shield is provided on a surface of a semiconductor device, the protective layer is formed on the outermost surface of the semiconductor device, and thus, the conductive shield can be prevented from being degraded. In that case, a contact hole may be provided in the protective layer as in the conductive shield so as not to prevent electrical connection between the antenna and the semiconductor integrated circuit.

For the insulator to be a support, a structure body in which a fibrous body is impregnated with an organic resin can be used.

Alternatively, for the insulator to be the support, a material that has a low modulus of elasticity and a high breaking strength may be used.

For main functions of the insulator to be the support, the resistance to physical force applied to the semiconductor device from the outside (also referred to as external stress) and an impact diffusion function for diffusing such force are necessary as described above. Accordingly, the insulator to be the support is preferably formed from a high-strength material. Typical examples of the high-strength material are a polyvinyl alcohol resin, a polyester resin, a polyamide resin, a polyethylene resin, an aramid resin, a polyparaphenylene benzobisoxazole resin, and a glass resin. By the provision of the insulator formed from a high-strength material having elasticity, a load such as local pressing force is diffused through the whole layer and absorbed, so that damage to the semiconductor device can be prevented.

More specifically, as the insulator to be the support, an aramid resin, a polyethylene terephthalate (PET) resin, a polyethylene naphthalate (PEN) resin, a polyether sulfone (PES) resin, a polyphenylene sulfide (PPS) resin, a polyimide (PI) resin, or the like can be used.

It is more preferable that the semiconductor integrated circuit be sandwiched between the structure bodies in which the fibrous body is impregnated with the organic resin and further sandwiched between the insulators including the resin.

Note that in one embodiment of the present invention, a semiconductor device refers to a device that can function using semiconductor properties. By using the present invention, a device that has a circuit including a semiconductor element (e.g., a transistor, a memory element, or a diode), and a semiconductor device such as a chip including a processor circuit can be manufactured.

According to one embodiment of the present invention, the conductive shield which covers the semiconductor integrated circuit prevents electrostatic breakdown (malfunction of the circuit or damage to a semiconductor element) of the semiconductor integrated circuit due to electrostatic discharge. Further, with the use of the insulator which sandwich the semiconductor integrated circuit, a thin and small semiconductor device that has resistance properties and high reliability can be provided. At this time, the antenna is provided over the conductive shield while the antenna is electrically connected to the semiconductor integrated circuit covered with the conductive shield and the insulator. Accordingly, a wireless communication capability is not impaired compared with a conventional device while the above advantageous effects can be obtained. Furthermore, shape defects and defective characteristics which are caused by external stress or electrostatic discharge are prevented in the manufacturing process, so that a semiconductor device can be manufactured with high yield.

BRIEF DESCRIPTION OF DRAWINGS

In the accompanying drawings:

FIGS. 6A to 6E illustrate a method for manufacturing a semiconductor device in one embodiment of the present invention;

FIGS. 7A and 7B illustrate a method for manufacturing a semiconductor device in one embodiment of the present invention;

BEST MODE FOR CARRYING OUT THE INVENTION

Figure 1A:
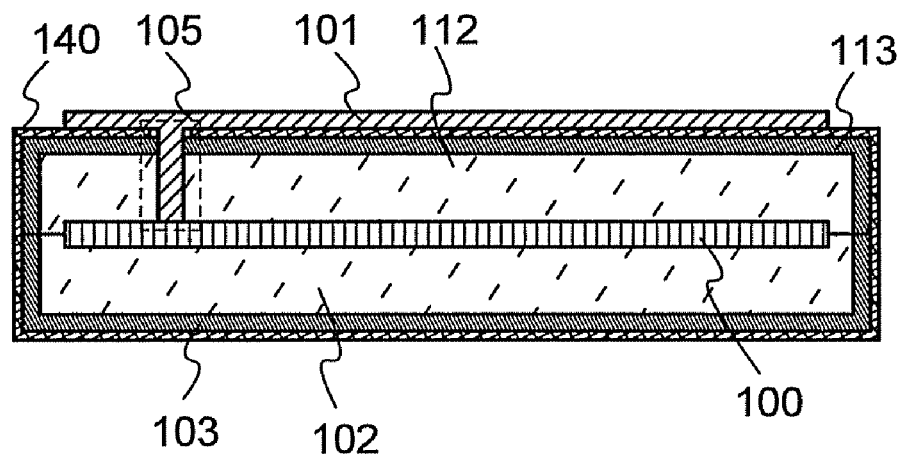
FIGS. 1A and 1B each illustrate an embodiment of a semiconductor device in one embodiment of the present invention.

Embodiments of the present invention will be described in detail with reference to the accompanying drawings. Note that the present invention is not limited to the following description, and it is easily understood by those skilled in the art that modes and details of the present invention can be variously changed without departing from the spirit and the scope of the present invention. Therefore, the present invention is not construed as being limited to the description of the embodiments. In the structures of the present invention described below, the same portions or portions having similar functions are denoted by the same reference numerals through different drawings, and the description on such portions is not repeated.

[Embodiment 1]

In this embodiment, a semiconductor integrated circuit which is separated from a substrate where the semiconductor integrated circuit is formed, and sandwiched between flexible insulators is described as an example. Note that in this specification, the substrate where the semiconductor integrated circuit is formed is also referred to as a formation substrate. Accordingly, the semiconductor integrated circuit is formed over the formation substrate with a separation layer therebetween. Note that as described above, the semiconductor integrated circuit may be formed directly over a flexible substrate without a separation step or the like.

Figure 1B:
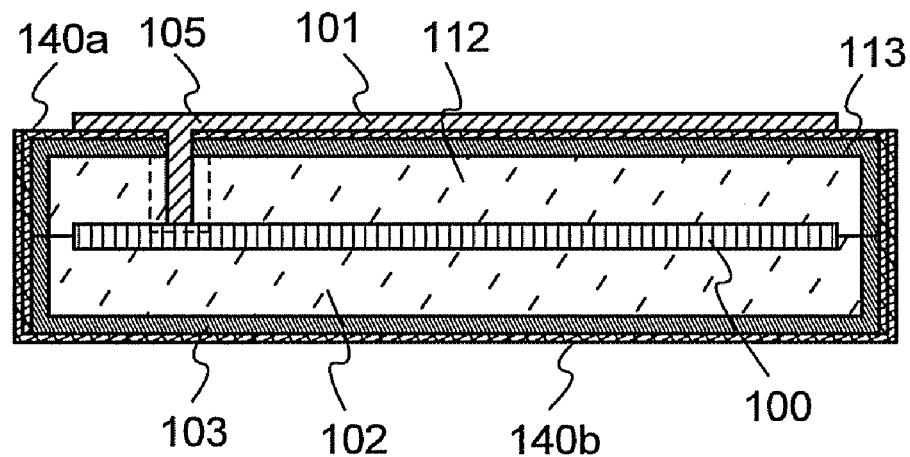

FIGS. 1A and 1B each illustrate a semiconductor device in this embodiment. In FIG. 1A, a semiconductor integrated circuit 100 is sandwiched between a first insulator 112 and a second insulator 102, and the external side of the first insulator 112 and the second insulator 102 is sandwiched between a third insulator 113 and a fourth insulator 103. A conductive shield 140 is provided on the external side of the third insulator 113 and the fourth insulator 103. An antenna 101 is provided over the conductive shield 140 and electrically connected to the semiconductor integrated circuit 100 through a contact hole 105 (indicated by a dotted frame) provided in the conductive shield 140, the third insulator 113, and the first insulator 112. Both the antenna 101 and the conductive shield 140 are made of conductive materials; thus, although not particularly illustrated here, an insulating layer is preferably provided between the antenna 101 and the conductive shield 140 so that the antenna 101 and the conductive shield 140 are not in direct contact with each other.

The third insulator 113 and the fourth insulator 103 are provided on the top surface and the bottom surface respectively and provided in contact with each other so as to cover a cross section of the semiconductor integrated circuit 100. In order to form such a structure, the third insulator 113 and the fourth insulator 103 may be melted and fused by heat generated when the semiconductor integrated circuit 100 is cut with a laser or the like, for example. Note that if the cross section of the semiconductor integrated circuit 100 can be favorably covered by melting and fusing the first insulator 112 and the second insulator 102, the third insulator 113 and the fourth insulator 103 are not necessarily provided.

The conductive shield 140 is provided on the entire surface of a region overlapping with the semiconductor integrated circuit 100 so as to cover (surround) the semiconductor integrated circuit 100. In other words, the conductive shield 140 extends over the side surface (the cross section) of a stack of the semiconductor integrated circuit 100, the first insulator 112, the second insulator 102, the third insulator 113, and the fourth insulator 103 so as to cover (surround) the stack.

In FIG. 1A, the conductive shield 140 is uniformly formed so as to cover the top side, the bottom side, and the side surface of the semiconductor integrated circuit. Alternatively, a conductive shield may be sequentially formed on the top surface and the back surface step by step depending on the process. In that case, the thickness of the side surface is sometimes increased because it corresponds to the thickness of a stack of conductive shields 140a and 140b as illustrated in FIG. 1B.

The semiconductor device in this embodiment is a non-contact signal processor having a function of sending and receiving a signal to/from an external device with wireless communication. Accordingly, the conductive shield 140 does not interfere with electromagnetic waves that should be sent and received by the antenna 101 included in the semiconductor device, and blocks static electricity applied from the outside to the semiconductor integrated circuit 100 in the semiconductor device. The conductive shield 140 diffuses static electricity applied by electrostatic discharge to let it go or prevents local electric charge (localization of electric charge) (i.e., prevents local potential difference), so that electrostatic breakdown of the semiconductor integrated circuit 100 can be prevented.

The antenna 101 is provided over the conductive shield 140 and electrically connected to the semiconductor integrated circuit 100 through the contact hole 105 (the dotted frame) provided in the conductive shield 140, the third insulator 113, and the first insulator 112. Such a structure can minimize adverse effects of the conductive shield 140 on sending and reception, so that a favorable communication function can be obtained.

Since the conductive shield 140 is provided on the top surface, the back surface, and the side surface of the semiconductor integrated circuit 100, a wide region of the semiconductor integrated circuit 100 is protected from static electricity from the outside. Accordingly, electrostatic breakdown can be prevented more effectively.

The conductive shields 140 are preferably formed under the same process conditions (a method, a material, and the thickness), or alternatively, they may be formed under different conditions. For example, when one of the top side and the bottom side of the semiconductor integrated circuit 100 has relatively poor resistance to electrostatic discharge (ESD), the thickness of a conductive shield on the side having the poor resistance may be increased.

Note that the semiconductor device in this embodiment operates by generating induced electromotive force by an externally applied electromagnetic wave (the semiconductor device has a wireless communication function). Accordingly, the conductive shield 140 needs to be formed using a conductive material that prevents electrostatic breakdown of the semiconductor integrated circuit 100 and transmits an electromagnetic wave.

It is generally known that electromagnetic waves are attenuated in a substance, particularly in a conductive material. Accordingly, in this embodiment, the conductive shield 140 is adequate to have a thickness needed to easily diffuse static electricity, and the thickness of the conductive shield 140 is preferably sufficiently reduced so that the conductive shield 140 can transmit an electromagnetic wave.

The thickness of the conductive shield 140 may be determined based on a frequency of an electromagnetic wave used for communication, and the resistivity and the transmissivity of a conductive material to be used.

For example, when the frequency of electromagnetic waves is 13.56 MHz and titanium (resistivity $\rho$: $5.5 \times 10^{-7}$ ($\Omega \cdot m$)) is used for the conductive shield 140, the thickness of the conductive shield 140 is set to at least approximately 100 nm or less. Thus, damage to the semiconductor device due to electrostatic discharge can be suppressed, and favorable communication with the outside can be achieved.

It is needless to say that a material used for the conductive shield 140 is not limited to titanium. For example, in the case of using indium tin oxide containing silicon oxide (also referred to as ITSO) having higher resistivity than titanium, the thickness of the conductive shield 140 may be set to at least approximately 700 nm or less.

Further, the lower limit of the thickness of the conductive shield is preferably set based on the resistivity. For example, when the resistivity of a conductive material used for the conductive shield is high, the conductive shield is preferably formed thick so that static electricity is effectively diffused. This is because, if the conductive shield is formed to be too thin using a conductive material with high resistivity, the sheet resistance is increased, static electricity cannot be effectively diffused when electrostatic discharge occurs, and a large amount of current flows into the semiconductor integrated circuit, which might cause damage to the semiconductor integrated circuit.

Accordingly, in order to effectively prevent damage to the semiconductor device due to static electricity, the thickness of the conductive shield is preferably set so that the sheet resistance of the conductive shield is $1.0 \times 10^7$ ohm/square or less, preferably $1.0 \times 10^4$ ohm/square or less, more preferably $1.0 \times 10^2$ ohm/square or less.

Note that in order to transmit electromagnetic waves, it is preferable that the thickness of the conductive shield 140 be as small as possible as long as the sheet resistance of the conductive shield 140 is within the above range.

In the case of using titanium or the like which has low resistivity as a conductive material, even if the conductive shield 140 is formed to be extremely thin, the sheet resistance can be sufficiently reduced and electromagnetic waves can be easily transmitted. In consideration of the manufacturing process and the like, the conductive shield 140 is preferably formed to a thickness of approximately 5 nm or more (preferably 10 nm or more).

On the other hand, in the case of using a compound of silicon oxide and indium tin oxide which have relatively high resistivity, the thickness of the conductive shield 140 is preferably at least greater than or equal to 5 nm, more preferably greater than or equal to 5 nm and less than or equal to 100 nm.

By forming the conductive shield 140 as described above, damage to the semiconductor device due to electrostatic discharge can be effectively suppressed, and a semiconductor device which is capable of favorably performing communication with the outside can be obtained.

Next, materials and the like which can be applied to the structures illustrated in FIGS. 1A and 1B will be described in detail.

The conductive shield 140 should have conductivity, and a conductive layer formed using a conductive material can be used.

A material and the thickness of such a conductive shield 140 are determined so that the conductive shield 140 does not interfere with electromagnetic waves to be sent and received by the antenna 101 and blocks static electricity. Accordingly, a highly reliable semiconductor device that has resistance to electrostatic breakdown and can send and receive data through an antenna with wireless communication can be provided.

For the conductive shield 140, a metal film, a metal nitride film, a metal oxide film, or the like; or a stack of these films can be used. The conductive shield 140 may be formed using, for example, an element selected from titanium, molybdenum, tungsten, aluminum, copper, silver, gold, nickel, platinum, palladium, iridium, rhodium, tantalum, cadmium, zinc, iron, silicon, germanium, zirconium, or barium; or an alloy material, a compound material, a nitride material, or an oxide material which contains any of the above elements as a main component.

As the nitride material, tantalum nitride, titanium nitride, or the like can be used.

As the oxide material, indium tin oxide (ITO), indium tin oxide containing silicon oxide (ITSO), organoindium, organotin, zinc oxide (ZnO), or the like can be used. Alternatively, indium zinc oxide (IZO) containing zinc oxide, zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

Alternatively, a semiconductor film having conductivity, which is obtained by adding an impurity element or the like to a semiconductor, or the like can be used. For example, a polycrystalline silicon film doped with an impurity element such as phosphorus can be used.

Further, for the conductive shield 140, a conductive macromolecule (also referred to as a conductive polymer) may be used. As the conductive macromolecule, a so-called π-electron conjugated conductive polymer can be used. For example, polyaniline and/or a derivative thereof, polypyrrole and/or a derivative thereof, polythiophene and/or a derivative thereof, and a copolymer of two or more kinds of those materials can be used.

Specific examples of a conjugated conductive polymer are polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(-ethoxypyrrole), poly(3-octoxypyrrole), poly (3-carboxylpyrrole), poly(3-methyl-4-carboxylpyrrole), poly(N-methylpyrrole), polythiophene, poly(3-methylthiophene), poly(-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

The conductive shield 140 formed using a material containing the conductive macromolecule may contain an organic resin or a dopant (e.g., a halogen, a Lewis acid, an inorganic acid, an organic acid, transition metal halide, an organic cyano compound, or a nonionic surfactant).

The conductive shield 140 can be formed by a dry process such as a sputtering method, a plasma CVD method, or an evaporation method; or a wet process such as a coating method, a printing method, or a droplet discharging method (an inkjet method).

Further, a protective layer may be stacked over the conductive shield 140. For example, a titanium film (with a thickness of approximately 5 nm to 100 nm) may be formed as the conductive shield 140, and a titanium oxide film may be stacked over the titanium film as the protective layer. By the provision of the protective layer, even when the conductive shield 140 is provided on a surface of a semiconductor device, the protective layer is formed on the outermost surface of the semiconductor device, and thus, the conductive shield 140 can be prevented from being degraded. The protective layer may have a thickness of approximately 10 nm to 200 nm. Note that as described above, the thickness of the protective layer is not particularly limited thereto when an insulator is provided so as not to make direct contact between the antenna 101 and the conductive shield 140.

Figure 2A:
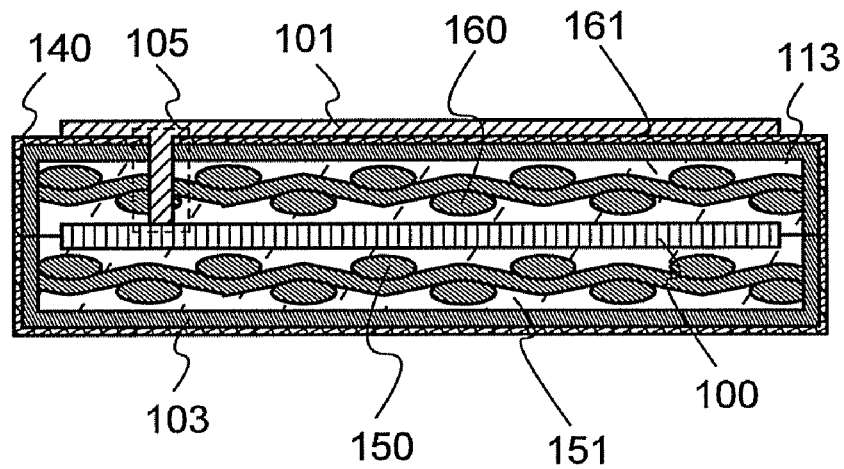
FIGS. 2A to 2C each illustrate an embodiment of a semiconductor device in one embodiment of the present invention.
Figure 2B:
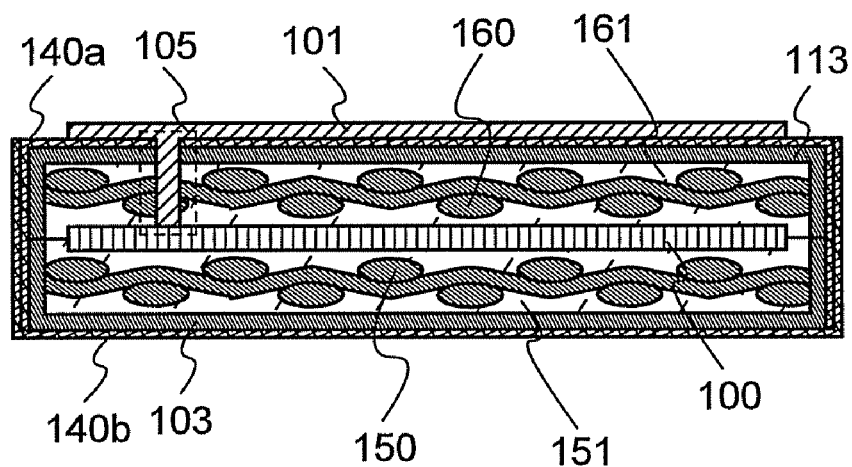
Figure 2C:
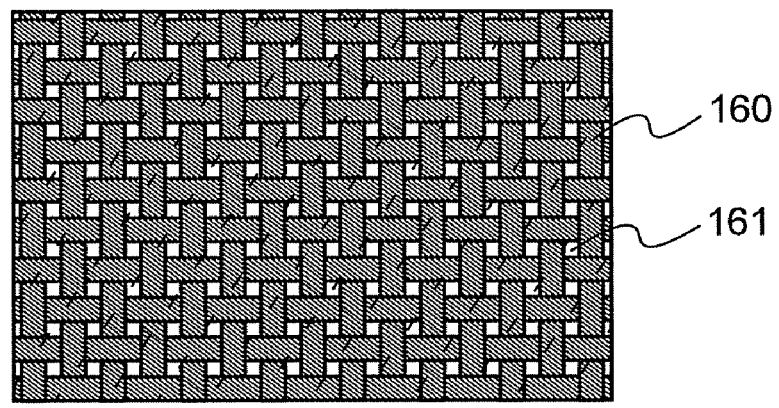

For the insulator, a structure body in which a fibrous body is impregnated with an organic resin can be used. FIGS. 2A to 2C each illustrate an example where a structure body in which a fibrous body is impregnated with an organic resin is used for the first insulator 112 and the second insulator 102. FIGS. 2A and 2B correspond to FIGS. 1A and 1B, respectively.

A structure body in which a fibrous body is impregnated with an organic resin is used for insulators corresponding to the first insulator 112 and the second insulator 102. In the structure bodies, fibrous bodies 150 and 160 are impregnated with organic resins 151 and 161, respectively.

FIG. 2C is a plan view of a woven fabric as the fibrous body 160 which is woven using fiber yarn bundles for warp and weft. As illustrated in FIG. 2C, the fibrous body 160 is woven using warp yarns spaced at regular intervals and weft yarns spaced at regular intervals. Such a fibrous body which is woven using the warp yarns and the weft yarns has regions without the warp yarns and the weft yarns. In the fibrous body 160, the fibrous body is more easily impregnated with the organic resin 161, whereby the adhesiveness between the fibrous body 160 and the semiconductor integrated circuit 100 can be increased.

Further, in the fibrous body 160, the density of the warp yarns and the weft yarns may be high so that the proportion of the regions without the warp yarns and the weft yarns is low.

The structure body in which the fibrous body 160 is impregnated with the organic resin 161 is also referred to as a prepreg. A prepreg is specifically formed in a following manner: after a fibrous body is impregnated with a varnish in which a matrix resin is diluted with an organic solvent, drying is performed so that the organic solvent is volatilized and the matrix resin is semi-cured. The thickness of the structure body is preferably 10 μm to 100 μm, more preferably 10 μm to 30 μm. When a structure body with such a thickness is used, a thin semiconductor device capable of being bent can be manufactured. For example, a prepreg with a modulus of elasticity of 13 GPa to 15 GPa and a modulus of rupture of 140 MPa can be used for the insulator.

Note that the structure body in which a fibrous body is impregnated with an organic resin may have a layered structure. In that case, the structure body may be a stack of a plurality of structure bodies in each of which a single-layer fibrous body is impregnated with an organic resin or may be a structure body in which a plurality of fibrous bodies stacked are impregnated with an organic resin. Further, when a plurality of structure bodies in each of which a single-layer fibrous body is impregnated with an organic resin are stacked, another layer may be provided between the structure bodies.

A thermosetting resin such as an epoxy resin, an unsaturated polyester resin, a polyimide resin, a bismaleimide-triazine resin, or a cyanate resin can be used as the organic resin 161. Alternatively, a thermoplastic resin such as a polyphenylene oxide resin, a polyetherimide resin, or a fluorine resin can be used as the organic resin 161. Still alternatively, a plurality of resins selected from the above thermosetting resins and thermoplastic resins may be used as the organic resin 161. By using the above organic resin, the fibrous body can be bonded to the semiconductor integrated circuit by heat treatment. Note that the higher the glass transition temperature of the organic resin 161 is, the less likely the organic resin 161 is damaged by local pressure, which is preferable.

Highly thermally conductive filler may be dispersed in the organic resin 161 or yarn bundles of fibers. Examples of the highly thermally conductive filler are aluminum nitride, boron nitride, silicon nitride, alumina, and a metal particle such as silver and copper. When the highly thermally conductive filler is included in the organic resin or the yarn bundles of fibers, heat generated in the semiconductor integrated circuit can be easily released to the outside. Accordingly, thermal storage in the semiconductor device can be suppressed, and thus deterioration of characteristics of the semiconductor device can be reduced.

The fibrous body 160 is a woven or nonwoven fabric using high-strength fibers of an organic compound or an inorganic compound and provided so as to partly overlap with each other. The high-strength fiber is specifically a fiber with a high modulus of elasticity in tension or a fiber with a high Young's modulus. Typical examples of the high-strength fiber are a polyvinyl alcohol fiber, a polyester fiber, a polyamide fiber, a polyethylene fiber, an aramid fiber, a polyparaphenylene benzobisoxazole fiber, a glass fiber, and a carbon fiber. An example of the glass fiber is a glass fiber using E glass, S glass, D glass, Q glass, or the like. Note that the fibrous body 160 may be formed from one kind of the above high-strength fibers or a plurality of the above high-strength fibers.

The fibrous body 160 may be a woven fabric which is woven using bundles of fibers (single yarns) (hereinafter the bundles of fibers are referred to as yarn bundles) for warp yarns and weft yarns, or a nonwoven fabric obtained by stacking yarn bundles of plural kinds of fibers randomly or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers which has been subjected to fiber opening with a high-pressure water stream, high-frequency vibration using liquid as a medium, continuous ultrasonic vibration, pressing with a roller, or the like may be used. A yarn bundle of fibers which is subjected to fabric opening has a large width, has a smaller number of single yarns in the thickness direction, and has an elliptical shape or a flat shape in cross section. Further, when a loosely twisted yarn is used as the bundle of fibers, the fiber bundle is easily flattened and has a cross section of an elliptical shape or a flat shape. The use of a yarn bundle having an elliptical shape or a flat shape in cross section in this manner can reduce the thickness of the fibrous body 160. Accordingly, the thickness of the structure body can be reduced, and thus a thin semiconductor device can be manufactured.

Note that in the drawings in this embodiment, the fibrous body 160 is illustrated as a plain-woven fabric using yarn bundles each having a cross section of an elliptical shape.

Further, in order to enhance the permeability of an organic resin into the inside of the yarn bundle of fibers, the fiber may be subjected to surface treatment. Examples of the surface treatment are corona discharge, plasma discharge, and the like for activating a surface of the fiber, and surface treatment using a silane coupling agent or a titanate coupling agent.

Alternatively, for the first insulator 112 and the second insulator 102, a material with a low modulus of elasticity and a high breaking strength may be used. For example, a film having rubber elasticity, which has a modulus of elasticity of 5 GPa to 12 GPa and a modulus of rupture of 300 MPa or more, can be used.

The first insulator 112 and the second insulator 102 are preferably formed from a high-strength material. Typical examples of the high-strength material are a polyvinyl alcohol resin, a polyester resin, a polyamide resin, a polyethylene resin, an aramid resin, a polyparaphenylene benzobisoxazole resin, and a glass resin. By providing the first insulator 112 and the second insulator 102 which are formed from a high-strength material having elasticity, a load such as local pressing force is diffused through the whole layer and absorbed, so that damage to the semiconductor device can be prevented.

More specifically, as the first insulator 112 and the second insulator 102, an aramid resin, a polyethylene terephthalate (PET) resin, a polyethylene naphthalate (PEN) resin, a polyether sulfone (PES) resin, a polyphenylene sulfide (PPS) resin, a polyimide (PI) resin, or the like can be used.

The first insulator 112 and the second insulator 102 may be bonded to the semiconductor integrated circuit 100 using a bonding layer. The bonding layer is a layer for bonding the first insulator 112 and the second insulator 102 to the semiconductor integrated circuit 100, and a thermosetting resin, an ultraviolet curable resin, an acrylic resin, a urethane resin, an epoxy resin, a silicone resin, or the like can be used. The thickness of the bonding layer may be approximately from 3 μm to 15 μm. In the case where the first insulator 112 and the second insulator 102 are bonded to the semiconductor integrated circuit 100 by heat treatment and pressure treatment, the bonding layer is not necessarily used.

Next, a method for manufacturing a semiconductor device of the present invention will be described with reference to FIGS. 3A to 3E.

Figure 3A:
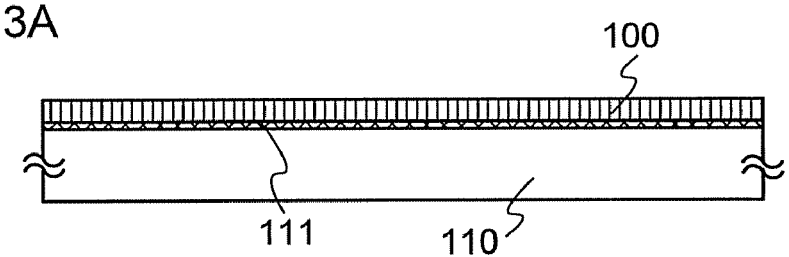
FIGS. 3A to 3E illustrate a method for manufacturing a semiconductor device in one embodiment of the present invention.
Figure 3B:
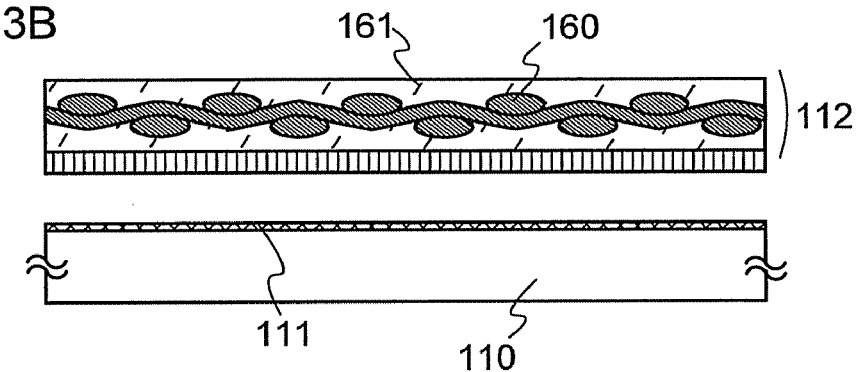

The semiconductor integrated circuit 100 is formed over a substrate 110 having an insulating surface, which is a formation substrate, with a separation layer 111 therebetween (see FIG. 3A).

As the substrate 110 which is the formation substrate, a glass substrate, a quartz substrate, a sapphire substrate, a ceramic substrate, a metal substrate having an insulating layer formed on its surface, or the like can be used. Alternatively, a plastic substrate which can withstand the process temperature in this embodiment may be used. In the manufacturing process of a semiconductor device, a formation substrate can be selected as appropriate depending on the process.

The separation layer 111 is formed to have a single-layer structure or a layered structure including a layer formed of an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy material or a compound material containing any of the elements as its main component by a sputtering method, a plasma CVD method, a coating method, a printing method, or the like. The crystalline structure of a layer containing silicon may be any one of an amorphous state, a microcrystalline state, or a polycrystalline state. Note that here, a coating method includes a spin coating method, a droplet discharging method, and a dispensing method in its category.

In the case where the separation layer 111 has a single-layer structure, a tungsten layer, a molybdenum layer, or a layer containing a mixture of tungsten and molybdenum is preferably formed. Alternatively, a layer containing oxide or oxynitride of tungsten, a layer containing oxide or oxynitride of molybdenum, or a layer containing oxide or oxynitride of a mixture of tungsten and molybdenum is formed. Note that the mixture of tungsten and molybdenum corresponds to an alloy of tungsten and molybdenum, for example.

In the case where the separation layer 111 has a layered structure, it is preferable that a tungsten layer, a molybdenum layer, or a layer containing a mixture of tungsten and molybdenum be formed as the first layer, and a layer containing oxide, nitride, oxynitride, or nitride oxide of tungsten, molybdenum, or a mixture of tungsten and molybdenum be formed as the second layer.

When the separation layer 111 is formed to have a layered structure including a layer containing tungsten and a layer containing oxide of tungsten, the layered structure may be formed as follows: the layer containing tungsten is formed, and an insulating layer made of oxide is formed thereover so that a layer containing oxide of tungsten is formed at the interface between the tungsten layer and the insulating layer. Further, a layer containing oxide of tungsten may be fainted by performing thermal oxidation treatment, oxygen plasma treatment, treatment with a solution having strong oxidation power such as ozone water, or the like on the surface of the layer containing tungsten. Furthermore, plasma treatment or heat treatment may be performed in an atmosphere of oxygen, nitrogen, dinitrogen monoxide, or a mixed gas of the above gas and another gas. This similarly applies to the case where a layer containing nitride, oxynitride, or nitride oxide of tungsten is formed, and after the layer containing tungsten is formed, a silicon nitride layer, a silicon oxynitride layer, or a silicon nitride oxide layer may be formed thereover.

Note that although the separation layer 111 is formed so as to be in contact with the substrate 110 according to the above step, one embodiment of the present invention is not limited to the above step. An insulating layer which serves as a base may be formed so as to be in contact with the substrate 110, and the separation layer 111 may be provided so as to be in contact with the insulating layer.

The semiconductor integrated circuit 100 and the first insulator 112 in which the fibrous body is impregnated with the organic resin are bonded, and the semiconductor integrated circuit 100 is separated from the substrate 110 using the separation layer 111 as a border. Here, the semiconductor integrated circuit 100 is provided on the first insulator 112 side (see FIG. 3B).

In this embodiment, the structure body in which the fibrous body 160 is impregnated with the organic resin 161 is used for the first insulator 112. The structure body is heated and subjected to pressure bonding so that the organic resin in the structure body is plasticized or cured. Note that in the case where the organic resin is an organic plastic resin, the organic resin which is plasticized is then cured by cooling to room temperature. By heating and pressure bonding, the organic resin is uniformly spread so as to be in close contact with the semiconductor integrated circuit and is cured. The step in which the structure body is subjected to pressure bonding is performed under an atmospheric pressure or a reduced pressure.

Note that for a step of transfer to another substrate, the following methods can be used as appropriate. A separation layer is formed between a substrate and a semiconductor integrated circuit, a metal oxide film is provided between the separation layer and the semiconductor integrated circuit, and the metal oxide film is crystallized to be embrittled, whereby the semiconductor integrated circuit is separated. Alternatively, an amorphous silicon film containing hydrogen is formed between a substrate with high heat resistance and a semiconductor integrated circuit, and the amorphous silicon film is removed by laser light irradiation or etching, whereby the semiconductor integrated circuit is separated. Alternatively, a separation layer is formed between a substrate and a semiconductor integrated circuit, a metal oxide film is provided between the separation layer and the semiconductor integrated circuit, the metal oxide film is crystallized to be embrittled, part of the separation layer is removed by etching using a solution or a fluoride halogen gas such as $NF_3$, $BrF_3$, or $ClF_3$, and then the semiconductor integrated circuit is separated at the embrittled metal oxide film. Further alternatively, a substrate where a semiconductor integrated circuit is formed is mechanically removed or is removed by etching using a solution or a fluoride halogen gas such as $NF_3$, $BrF_3$, or $ClF_3$. Alternatively, a film containing nitrogen, oxygen, hydrogen, or the like (e.g., an amorphous silicon film containing hydrogen, an alloy film containing hydrogen, or an alloy film containing oxygen) is used as a separation layer, and the separation layer is irradiated with laser light so that nitrogen, oxygen, or hydrogen contained in the separation layer is discharged as a gas, whereby separation of a semiconductor integrated circuit from a substrate is promoted.

By combining the above peeling methods, the transferring step can be more easily performed. In other words, separation can be performed with physical force (by a machine or the like) after the separation layer is etched by laser light irradiation, a gas, a solution, or the like or mechanically removed with a sharp knife, a scalpel, or the like so that the separation layer and the semiconductor integrated circuit are easily separated from each other.

Alternatively, the semiconductor integrated circuit may be separated from the formation substrate while a liquid is placed at an interface between the separation layer and the semiconductor integrated circuit.

Figure 3C:
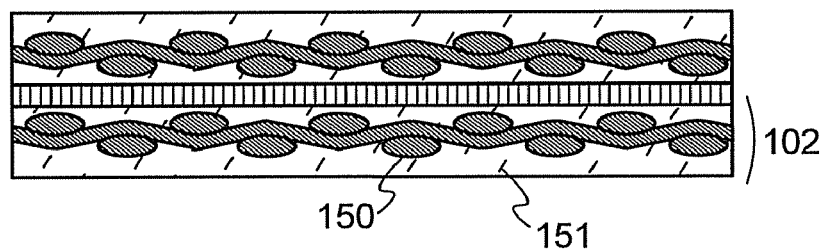

The structure body is subjected to heat and pressure bonding so that the second insulator 102 is bonded to the exposed separation surface of the semiconductor integrated circuit 100, and the semiconductor integrated circuit 100 is sandwiched between the first insulator 112 and the second insulator 102 which is opposite to the first insulator 112 (see FIG. 3C).

Like the first insulator 112, the structure body in which the fibrous body 150 is impregnated with the organic resin 151 is used for the second insulator 102.

Figure 3D:
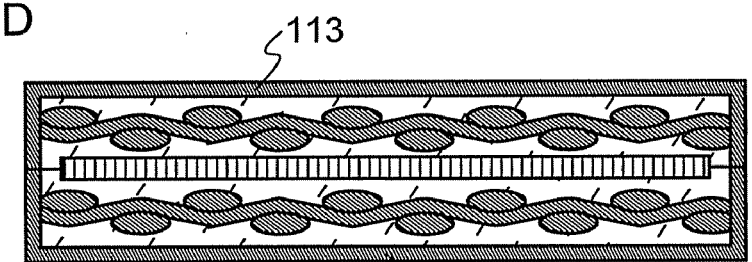

As described above, the third insulator 113 and the fourth insulator 103 may be provided above and below the first insulator 112 and the second insulator 102, respectively (see FIG. 3D).

Although not specifically illustrated, the first insulator 112 and the second insulator 102 sandwich a plurality of semiconductor integrated circuits 100 so that the plurality of semiconductor integrated circuits 100 are arranged in a plane direction. The plurality of the semiconductor integrated circuits 100 are cut into individual semiconductor integrated circuits to manufacture semiconductor integrated circuit chips. The semiconductor integrated circuits 100 are cut by laser light irradiation in this embodiment; however, a cutting means is not particularly limited as long as the semiconductor integrated circuits 100 can be physically cut off.

By cutting the semiconductor integrated circuits by laser light irradiation, at the cut surface, the first insulator 112 and the second insulator 102 are melted and fused together, and the third insulator 113 and the fourth insulator 103 are melted and fused together. Accordingly, the semiconductor integrated circuit 100 is sealed with the first insulator 112 and the second insulator 102 and with the third insulator 113 and the fourth insulator 103. As described above, the third insulator 113 and the fourth insulator 103 are provided to cover the cross section of the semiconductor integrated circuit 100 more favorably in this step, which is one advantageous effect of the third insulator 113 and the fourth insulator 103. That is, if the cross section of the semiconductor integrated circuit 100 can be covered with the first insulator 112 and the second insulator 112 in a sufficiently favorable manner, the structure is not particularly limited to the above structure.

Next, the conductive shield 140 is formed so as to cover (surround) the third insulator 113 and the fourth insulator 103. First, a conductive shield is formed on the surface and the cut surface of the third insulator 113, and a conductive shield is formed on the surface and the cut surface of the fourth insulator 103 (see FIG. 3E). In this embodiment, as the conductive shield 140, a titanium film with a thickness of 10 nm (greater than 0 and less than or equal to 1 μm, preferably greater than or equal to 5 nm and less than or equal to 100 nm) is formed by a sputtering method.

Figure 3E:
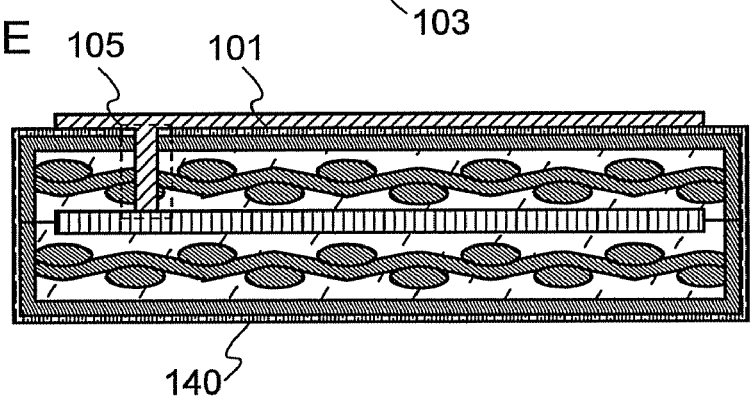

Then, the contact hole 105 (the dotted frame) is provided in the conductive shield 140, the third insulator 113, and the first insulator 112, and the antenna 101 is formed so as to be electrically connected to the semiconductor integrated circuit 100 (see FIG. 3E). The semiconductor integrated circuit 100 and the antenna 101 can be electrically connected to each other in such a manner that the contact hole is formed, and then, the antenna is directly formed using a conductive material. Alternatively, the semiconductor integrated circuit 100 and the antenna 101 may be electrically connected to each other in such a manner that the antenna 101 is separately formed over a film-shaped substrate, and the semiconductor integrated circuit 100 and the antenna 101 are attached to each other using a conductive paste or the like through a contact hole.

As described above, an insulating layer may be provided between the antenna 101 and the conductive shield 140 so that the antenna 101 and the conductive shield 140 are not in direct contact with each other.

The thus formed semiconductor integrated circuit 100 is sealed with the first insulator 112 and the second insulator 102. Moreover, the semiconductor integrated circuit 100 has a structure where the semiconductor integrated circuit 100 is protected from electrostatic discharge by the conductive shield 140 provided on the external side and the cut surface of the first insulator 112 and the second insulator 102, which correspond to the top surface and the back surface of a semiconductor device.

As described above, by the conductive shield 140 which covers the semiconductor integrated circuit 100, electrostatic breakdown (malfunction of the circuit or damage to a semiconductor element) of the semiconductor integrated circuit 100 due to electrostatic discharge can be prevented. Moreover, with the use of a pair of insulators which sandwich the semiconductor integrated circuit 100, a thin and small semiconductor device that has resistance properties and high reliability can be provided. Further, shape defects and defective characteristics which are caused by external stress or electrostatic discharge are prevented in the manufacturing process, so that a semiconductor device can be manufactured with high yield.

[Embodiment 2]

In this embodiment, a method where a highly reliable semiconductor device is manufactured with high yield will be described in detail with reference to FIGS. 4A to 4C and FIGS. 5A to 5C. In this embodiment, a CMOS (complementary metal oxide semiconductor) is described as an example of the semiconductor device.

Figure 4A:
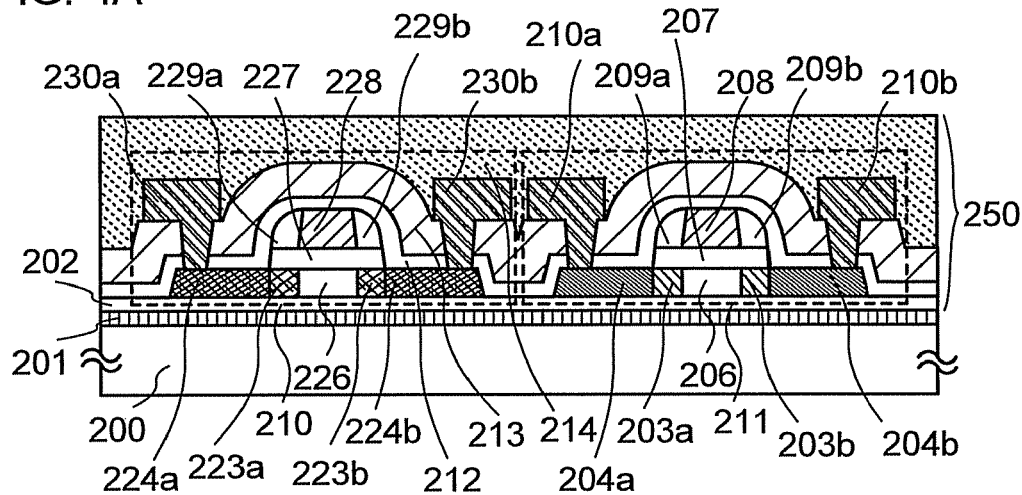
FIGS. 4A to 4C illustrate a method for manufacturing a semiconductor device in one embodiment of the present invention.
Figure 4B:
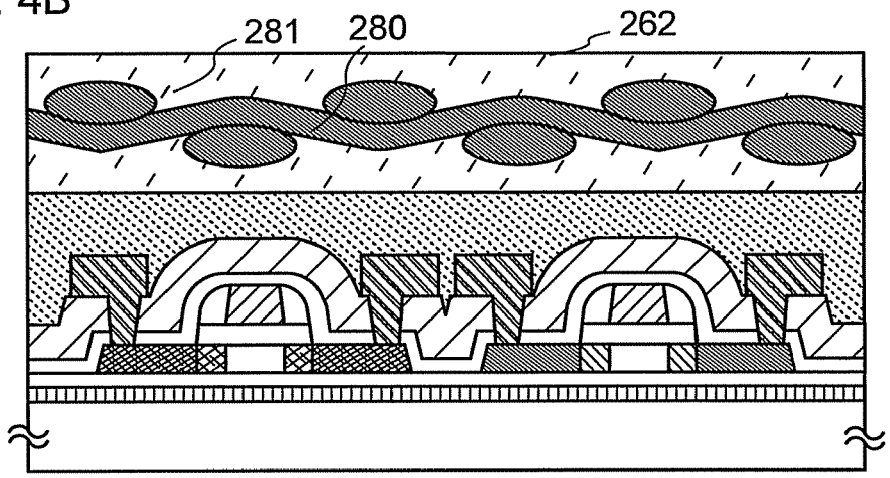
Figure 4C:
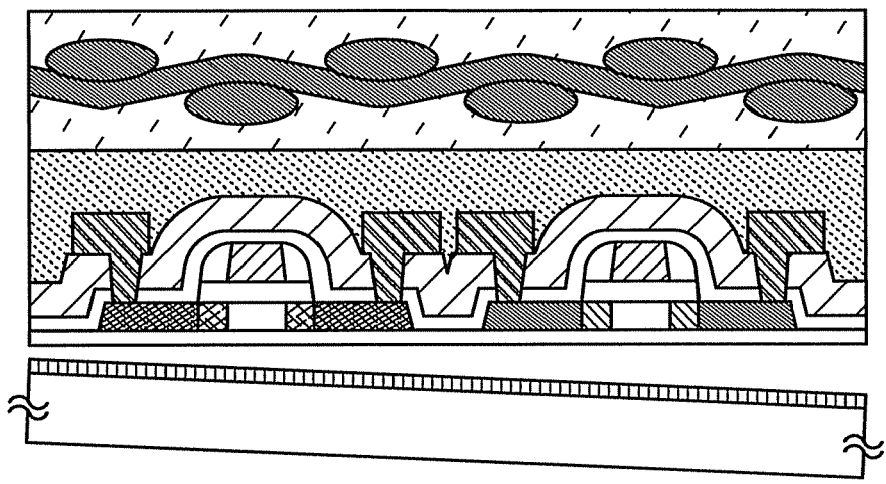

A base film 202, transistors 210 and 211, an insulating film 212, an insulating film 213, and an insulating layer 214 are provided over a substrate 200 having an insulating surface, which is a formation substrate, with a separation layer 201 therebetween; accordingly, a semiconductor integrated circuit 250 is formed (see FIG. 4A).

The transistor 210 is a thin film transistor and includes source/drain regions 224a and 224b, impurity regions 223a and 223b whose impurity concentrations are lower than those of the source/drain regions 224a and 224b, a channel formation region 226, a gate insulating layer 227, a gate electrode layer 228, and insulating layers 229a and 229b having a sidewall structure. The source/drain regions 224a and 224b are in contact with and electrically connected to wiring layers 230a and 230b respectively which function as a source electrode layer and a drain electrode layer. In this embodiment, the transistor 210 is a p-channel thin film transistor, in which the source/drain regions 224a and 224b and the impurity regions 223a and 223b which are LDD (lightly doped drain) regions contain an impurity element imparting p-type conductivity (e.g., boron (B), aluminum (Al), or gallium (Ga)).

The transistor 211 is a thin film transistor and includes source/drain regions 204a and 204b, impurity regions 203a and 203b whose impurity concentrations are lower than those of the source/drain regions 204a and 204b, a channel formation region 206, a gate insulating layer 207, a gate electrode layer 208, and insulating layers 209a and 209b having a sidewall structure. The source/drain regions 204a and 204b are in contact with and electrically connected to wiring layers 210a and 210b respectively which function as a source electrode layer and a drain electrode layer. In this embodiment, the transistor 211 is an n-channel thin film transistor, in which the source/drain regions 204a and 204b and the impurity regions 203a and 203b which are LDD (lightly doped drain) regions contain an impurity element imparting n-type conductivity (e.g., phosphorus (P) or arsenic (As)).

Next, a first insulator 262 is Ruined over the semiconductor integrated circuit 250. As the first insulator 262, a structure body in which a fibrous body 280 is impregnated with an organic resin 281 may be used. The semiconductor integrated circuit 250 and the first insulator 262 are bonded to each other, and the semiconductor integrated circuit 250 is separated from the substrate 200 using the separation layer 201 as the interface. Here, the semiconductor integrated circuit 250 is provided on the first insulator 262 side (see FIGS. 4B and 4C).

Figure 5A:
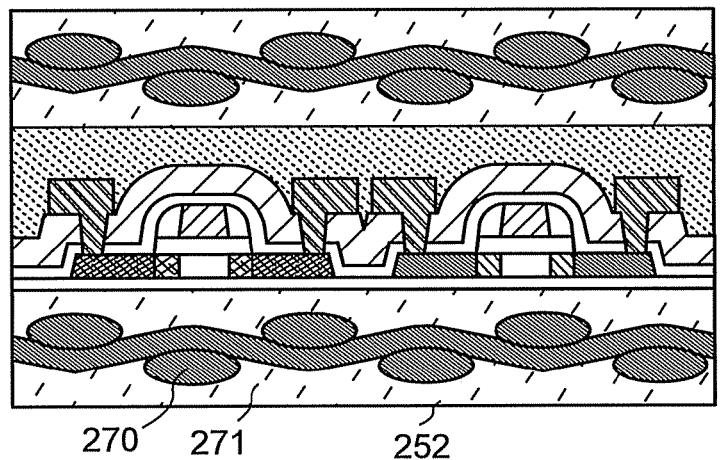
FIGS. 5A to 5C illustrate a method for manufacturing a semiconductor device in one embodiment of the present invention.
Figure 5B:
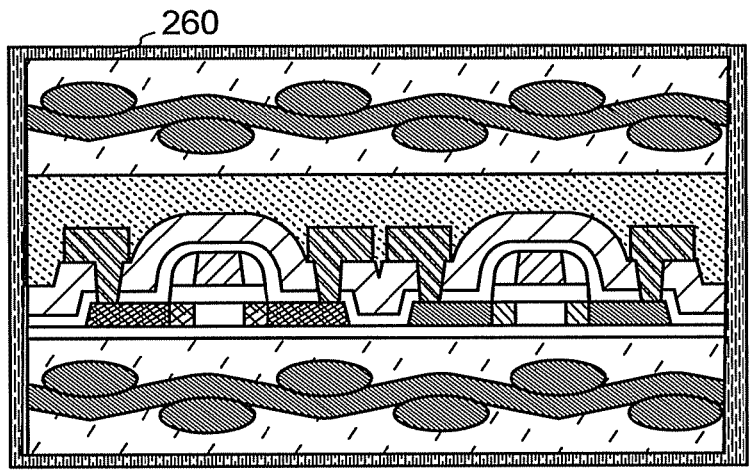
Figure 5C:
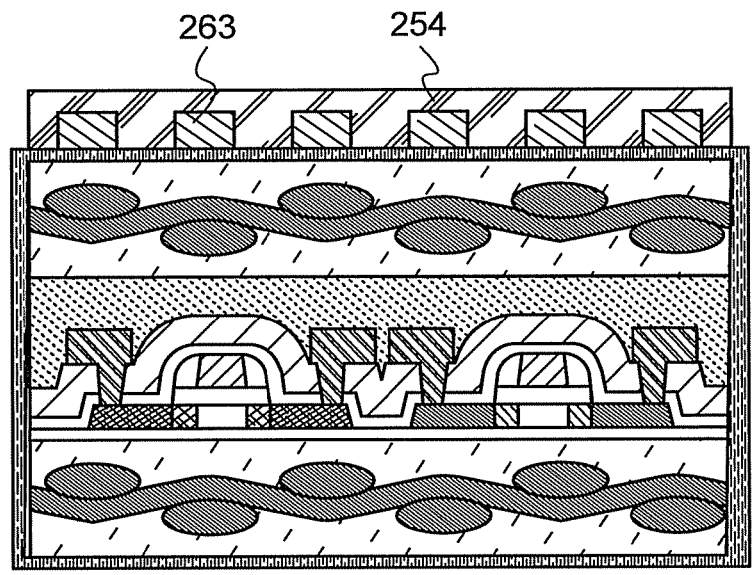

The structure body is subjected to heat and pressure bonding so that a second insulator 252 is bonded to the exposed separation surface of the semiconductor integrated circuit 250, and the semiconductor integrated circuit 250 is sandwiched between the first insulator 262 and the second insulator 252 (see FIG. 5A).

Like the first insulator 262, a structure body in which a fibrous body 270 is impregnated with an organic resin 271 is used for the second insulator 252.

Although not specifically illustrated, the first insulator 262 and the second insulator 252 sandwich a plurality of semiconductor integrated circuits. The plurality of semiconductor integrated circuits are cut into individual semiconductor integrated circuits 250 to manufacture semiconductor integrated circuit chips. The semiconductor integrated circuits 250 are cut by laser light irradiation in this embodiment; however, a cutting means is not particularly limited as long as the semiconductor integrated circuits 250 can be physically cut off. The semiconductor integrated circuit 250 is sealed in such a manner that the vicinity of the cut surface of the first insulator 262 and the second insulator 252 is melted and fused by heat generated by laser irradiation.

Note that as has been described in Embodiment 1, a third insulator and a fourth insulator may be provided outside the first insulator 262 and the second insulator 252 in order to cover the cross section of the semiconductor integrated circuit 250 more favorably.

Next, a conductive shield 260 is formed so as to cover (surround) the first insulator 262 and the second insulator 252. First, a conductive shield is formed on the surface and the cut surface of the first insulator 262, and a conductive shield is formed on the surface and the cut surface of the second insulator 252 (see FIG. 5B). In this embodiment, a metal film is used as the conductive shield 260. Specifically, a titanium film with a thickness of 10 nm (preferably greater than or equal to 5 nm and less than or equal to 100 nm) is formed by a sputtering method.

After that, a conductive layer 263 that functions as an antenna is formed over the conductive shield 260, and an inorganic insulating layer 254 is formed over the conductive layer 263 as a protective layer. In this embodiment, a silicon nitride film is formed as the inorganic insulating layer 254. The conductive layer 263 is electrically connected to the semiconductor integrated circuit 250 through a contact hole provided in the conductive shield and the first insulator. As has been described in Embodiment 1, although not particularly illustrated, an insulating layer may be provided so that the conductive shield and the antenna are not in direct contact with each other (see FIG. 5C).

The thus formed semiconductor integrated circuit 250 is sealed with the first insulator 262 and the second insulator 252. Moreover, the semiconductor integrated circuit 250 has a structure where the semiconductor integrated circuit 250 is protected from electrostatic discharge by the conductive shield 260 provided on the external side and the cut surface of the first insulator 262 and the second insulator 252, which correspond to the top surface and the back surface of a semiconductor device.

The conductive shield 260 transmits electromagnetic waves that should be sent and received by the conductive layer 263 which is the antenna included in the semiconductor device, and blocks static electricity applied from the outside to the semiconductor integrated circuit 250 in the semiconductor device. The conductive shield 260 diffuses static electricity applied by electrostatic discharge to let it go or prevents local electric charge (localization of electric charge) (i.e., prevents local potential difference), so that electrostatic breakdown of the semiconductor integrated circuit 250 can be prevented.

Since the insulators and the conductive shield are provided so as to sandwich the semiconductor integrated circuit, adverse effects of external stress or electrostatic discharge on the semiconductor integrated circuit, such as damage or deterioration in characteristics, can be prevented in a manufacturing process. Thus, the semiconductor device can be manufactured with high yield.

When a flexible insulator is used, the semiconductor device manufactured in this embodiment can have flexibility.

Semiconductor layers included in the transistors 210 and 211 can be formed using any of the following materials: an amorphous semiconductor (hereinafter also referred to as "AS") manufactured by a vapor deposition method or a sputtering method using a semiconductor material gas typified by silane or germane; a polycrystalline semiconductor formed by crystallizing the amorphous semiconductor with the use of light energy or thermal energy; or a microcrystalline (also referred to as semi-amorphous or microcrystal) semiconductor (hereinafter also referred to as "SAS"). The semiconductor layer can be formed by a sputtering method, an LPCVD method, a plasma CVD method, or the like.

The microcrystalline semiconductor film belongs to a metastable state which is intermediate between an amorphous state and a single crystal state when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$ which represents a peak of the Raman spectrum of single crystal silicon. That is, the peak of the Raman spectrum of the microcrystalline silicon exists between 480 cm$^{-1}$ which represents amorphous silicon and 520 cm$^{-1}$ which represents single crystal silicon. The microcrystalline semiconductor includes hydrogen or halogen of at least 1 atomic % to terminate a dangling bond. Moreover, a rare gas element such as helium, argon, krypton, or neon may be included to further promote lattice distortion, so that the stability is enhanced and a favorable microcrystalline semiconductor film can be obtained.

The microcrystalline semiconductor film can be formed by a high-frequency plasma CVD method with a frequency of several tens to several hundreds of megahertz or a microwave plasma CVD apparatus with a frequency of 1 GHz or more. The microcrystalline semiconductor film can be typically formed using a dilution of silicon hydride or silicon halide such as $SiH_4$, $Si_2H_6$, $SiH_2Cl_2$, $SiHCl_3$, $SiCl_4$, or $SiF_4$ with hydrogen. Moreover, with a dilution of silicon hydride or silicon halide with one or plural kinds of rare gas elements selected from helium, argon, krypton, and neon in addition to hydrogen, the microcrystalline semiconductor film can be fored. In that case, the flow rate of hydrogen to silicon hydride is set to be 5:1 to 200:1, preferably 50:1 to 150:1, more preferably 100:1.

A typical example of an amorphous semiconductor is hydrogenated amorphous silicon, and a typical example of a crystalline semiconductor is polysilicon (polycrystalline silicon). Polysilicon includes so-called high-temperature polysilicon formed using polysilicon which is formed at processing temperatures of 800° C. or more as a main material, so-called low-temperature polysilicon formed using polysilicon which is formed at processing temperatures of 600° C. or less as a main material, and polysilicon formed by crystallization of amorphous silicon using an element that promotes crystallization or the like. It is needless to say that a microcrystalline semiconductor, or a semiconductor which includes a crystalline phase in part of a semiconductor layer can be used as described above.

As the semiconductor material, as well as an element of silicon (Si), germanium (Ge), or the like, a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide; an oxide semiconductor formed using a plurality of the above oxide semiconductors; or the like can be used. For example, an oxide semiconductor containing zinc oxide, indium oxide, and gallium oxide may be used. Note that in the case where zinc oxide is used for the semiconductor layer, a single layer or a stack of $Y_2O_3$, $Al_2O_3$, or $TiO_2$ is preferably used as the gate insulating layer, and indium tin oxide (ITO), Au, Ti, or the like is preferably used for the gate electrode layer, the source electrode layer, and the drain electrode layer. Moreover, In, Ga, or the like can be added to ZnO.

In the case where a crystalline semiconductor layer is used as the semiconductor layer, the crystalline semiconductor layer may be formed by a variety of methods (e.g., a laser crystallization method, a thermal crystallization method, and a thermal crystallization method using an element that promotes crystallization, such as nickel). Further, a microcrystalline semiconductor, which is an SAS, can be crystallized by laser irradiation to increase its crystallinity. When the element that promotes crystallization is not introduced, before an amorphous silicon film is irradiated with laser light, the amorphous silicon film is heated at 500° C. for one hour under a nitrogen atmosphere to release hydrogen contained in the amorphous silicon film such that the concentration of hydrogen becomes $1 \times 10^{20}$ atoms/cm$^3$ or less. This is because when the amorphous silicon film containing a high amount of hydrogen is irradiated with laser light, the planarity of the surface is extremely degraded and favorable crystallinity is not obtained.

In a crystallization step in which an amorphous semiconductor layer is crystallized to form a crystalline semiconductor layer, an element promoting crystallization (also referred to as a catalyst element or a metal element) may be added to the amorphous semiconductor layer and heat treatment (at 550° C. to 750° C. for 3 minutes to 24 hours) may be performed for crystallization. The element promoting crystallization can be one or more of elements such as iron (Fe), nickel (Ni), cobalt (Co), ruthenium (Ru), rhodium (Rh), palladium (Pd), osmium (Os), iridium (Ir), platinum (Pt), copper (Cu), and gold (Au).

A method of introducing a metal element into an amorphous semiconductor layer is not particularly limited as long as it is a method capable of providing the metal element on a surface of or inside the amorphous semiconductor layer. For example, a sputtering method, a CVD method, a plasma processing method (including a plasma CVD method), an adsorption method, or a method for applying a solution of metal salt can be used. Among the above methods, the method using a solution is convenient and has an advantage of easily adjusting the concentration of a metal element. In addition, in order to improve the wettability of the surface of the amorphous semiconductor layer to spread an aqueous solution on the entire surface of the amorphous semiconductor layer, an oxide film is preferably formed by UV light irradiation in an oxygen atmosphere, thermal oxidation, treatment using ozone water containing hydroxyl radical or hydrogen peroxide, or the like.

In order to remove or reduce the element promoting crystallization from the crystalline semiconductor layer, a semiconductor layer containing an impurity element is formed in contact with the crystalline semiconductor layer and is made to function as a gettering sink. As the impurity element, an impurity element imparting n-type conductivity, an impurity element imparting p-type conductivity, a rare gas element, or the like can be used. For example, one or a plurality of kinds of elements such as phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed over the crystalline semiconductor layer containing an element promoting crystallization, and heat treatment (at 550° C. to 750° C. for 3 minutes to 24 hours) is performed. The element which promotes crystallization in the crystalline semiconductor layer moves into the semiconductor layer containing the rare gas element, so that the element which promotes crystallization in the crystalline semiconductor layer is removed or reduced. Then, the semiconductor layer containing the rare gas element, which serves as the gettering sink, is removed.

The amorphous semiconductor layer may be crystallized using a combination of heat treatment and laser light irradiation. Alternatively, one of the heat treatment and the laser light irradiation may be performed plural times.

Further, a crystalline semiconductor layer may be formed over a substrate directly by a plasma method. Alternatively, a crystalline semiconductor layer may be selectively formed over a substrate by a plasma method.

The gate insulating layers 207 and 227 may be formed using silicon oxide or may be formed to have a layered structure including silicon oxide and silicon nitride. The gate insulating layers 207 and 227 may be formed by depositing an insulating film by a plasma CVD method or a low pressure CVD method or may be formed by solid-phase oxidation or solid-phase nitridation by plasma treatment. This is because a gate insulating layer formed by oxidizing or nitriding a single crystal semiconductor layer by plasma treatment is dense and has high withstand voltage and high reliability. For example, a surface of the semiconductor layer is oxidized or nitrided using nitrous oxide ($N_2O$) diluted with Ar by 1 to 3 times (flow rate) by application of a microwave (2.45 GHz) power of 3 kW to 5 kW at a pressure of 10 Pa to 30 Pa. By this treatment, an insulating film with a thickness of 1 nm to 10 nm (preferably 2 nm to 6 nm) is formed. Further, nitrous oxide ($N_2O$) and silane ($SiH_4$) are introduced, and a silicon oxynitride film is formed by a vapor deposition method by application of a microwave (2.45 GHz) power of 3 kW to 5 kW at a pressure of 10 Pa to 30 Pa, whereby the gate insulating layer is formed. The combination of the solid phase reaction and the reaction by the vapor deposition method can form a gate insulating layer with a low interface state density and excellent withstand voltage.

As the gate insulating layers 207 and 227, a high dielectric constant material such as zirconium dioxide, hafnium oxide, titanium dioxide, or tantalum pentoxide may be used. By using a high dielectric constant material for the gate insulating layers 207 and 227, the gate leakage current can be reduced The gate electrode layers 208 and 228 can be formed by a CVD method, a sputtering method, a droplet discharging method, or the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, or Ba; or an alloy material or a compound material containing any of the elements as its main component. Alternatively, a semiconductor film typified by a polycrystalline silicon film doped with an impurity element such as phosphorus, or an AgPdCu alloy may be used. The gate electrode layer may have a single-layer structure or a layered structure, for example, a two-layer structure of a tungsten nitride film and a molybdenum film, or a three-layer structure in which a 50-nm-thick tungsten film, a 500-nm-thick aluminum-silicon alloy (Al—Si) film, and a 30-nm-thick titanium nitride film are sequentially stacked. In the case of employing the three-layer structure, tungsten nitride may be used instead of tungsten for the first conductive film; an aluminum-titanium alloy (Al—Ti) film may be used instead of the aluminum-silicon (Al—Si) alloy film for the second conductive film; or a titanium film may be used instead of the titanium nitride film for the third conductive film.

As the gate electrode layers 208 and 228, a material that transmits visible light can be used. As a light-transmitting conductive material, indium tin oxide (ITO), indium tin oxide containing silicon oxide (ITSO), organoindium, organotin, zinc oxide (ZnO), or the like can be used. Alternatively, indium zinc oxide (IZO) containing zinc oxide, ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

When the gate electrode layers 208 and 228 are formed by employing an etching method for processing, a mask may be formed and the gate electrode layers 208 and 228 may be processed by a dry etching method. The gate electrode layer can be etched into a tapered shape by inductively coupled plasma (ICP) etching and by appropriate adjustment of etching conditions (e.g., the amount of electric power applied to a coiled electrode, the amount of electric power applied to an electrode on the substrate side, and the electrode temperature on the substrate side). Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used as appropriate as an etching gas.

The insulating layers 209*a*, 209*b*, 229*a*, and 229*b* having a sidewall structure may be formed in a self-aligned manner in the following manner: an insulating layer covering the gate electrode layer and the semiconductor layer is formed, and then the insulating layer is processed by anisotropic etching using a reactive ion etching (RIE) method. Here, although there is no particular limitation on the insulating layers, the insulating layers are preferably formed using silicon oxide with favorable step coverage, which is formed by reaction of TEOS (tetraethyl orthosilicate), silane, or the like with oxygen, nitrous oxide, or the like. The insulating layer can be formed by a thermal CVD method, a plasma CVD method, an atmospheric pressure CVD method, a bias ECR CVD method, a sputtering method, or the like. The insulating layer can be formed by a thermal CVD method, a plasma CVD method, an atmospheric pressure CVD method, a bias ECR CVD method, a sputtering method, or the like.

In this embodiment, a single-gate structure is described as the structure of the transistor; however, the transistor may have a multi-gate structure such as a double-gate structure. In that case, gate electrode layers may be provided above and below the semiconductor layer, or a plurality of gate electrode layers may be provided only on one side of (above or below) the semiconductor layer.

Further, silicide may be provided in the source region and the drain region of the transistor. The silicide is formed in such a manner that conductive films are formed over the source region and the drain region of the semiconductor layer, and silicon of the semiconductor layer in the exposed source region and drain region reacts with the conductive films by heat treatment, a GRTA method, an LRTA method, or the like. The silicide may be formed by laser irradiation or light irradiation with a lamp. As a material of the conductive film for forming the silicide, any of the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like.

The wiring layers 210*a*, 210*b*, 230*a*, and 230*b* which function as the source electrode layers and the drain electrode layers can be formed in such a manner that a conductive film is formed by a PVD method, a CVD method, an evaporation method, or the like and then the conductive film is etched into a desired shape. Alternatively, the wiring layer can be selectively formed at a predetermined position by a printing method, an electroplating method, or the like. Further, a reflow method or a damascene method may be used as well. The wiring layers 210*a*, 210*b*, 230*a*, and 230*b* can be formed using metal such as Ag, Au, Cu, Ni, Pt, Pd, Ti, Rh, W, Al, Ta, Mo, Cd, Zn, Fe, Ti, Zr, or Ba; a semiconductor such as Si or Ge; or an alloy or a nitride thereof.

Alternatively, a light-transmitting conductive material such as indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, or indium tin oxide containing titanium oxide can be used.

For the insulating films 212 and 213 and the insulating layer 214, an inorganic insulating material such as silicon oxide, silicon nitride, silicon oxynitride, aluminum oxide, aluminum nitride, or aluminum oxynitride can be used.

As described above, by the conductive shield which covers the semiconductor integrated circuit, electrostatic breakdown (malfunction of the circuit or damage to a semiconductor element) of the semiconductor integrated circuit due to electrostatic discharge can be prevented. Moreover, with the use of the insulators which cover the semiconductor integrated circuit, a thin and small semiconductor device that has resistance properties and high reliability can be provided. Further, shape defects and defective characteristics which are caused by external stress or electrostatic discharge are prevented in the manufacturing process, so that a semiconductor device can be manufactured with high yield.

A memory element including a semiconductor layer as well as a semiconductor element such as a field-effect transistor can be applied to the semiconductor device which is one embodiment of the present invention. Accordingly, a semiconductor device which can meet functions required for various applications can be manufactured and provided.

[Embodiment 3]

In this embodiment, as for a semiconductor device for achieving higher reliability and a method for manufacturing the semiconductor device, an example of a semiconductor device including a memory will be described with reference to FIGS. 6A to 6E, FIGS. 7A and 7B, and FIGS. 8A and 8B.

A semiconductor device in this embodiment includes a memory cell array as a memory element and a driver circuit portion which drives the memory cell array.

A separation layer 301 is formed over a substrate 300 which is a formation substrate having an insulating surface, and an insulating film 302 which functions as a base film is formed over the separation layer 301.

Then, a semiconductor film is formed over the insulating film 302. The semiconductor film may be formed to a thickness of 25 nm to 200 nm (preferably 30 nm to 150 nm) by a sputtering method, an LPCVD method, a plasma CVD method, or the like.

In this embodiment, an amorphous semiconductor film is formed over the insulating film 302 and crystallized by laser light, so that a semiconductor film which is a crystalline semiconductor film is formed.

The thus obtained semiconductor film is selectively doped with the slight amount of impurity elements (boron or phosphorus) for controlling the threshold voltage of a thin film transistor. This doping with the impurity element may be performed on the amorphous semiconductor film before the crystallization step. When the amorphous semiconductor film is doped with the impurity element, the impurity can be activated by heat treatment for crystallization which is to be performed later. Further, defects and the like generated during the doping can be reduced as well.

Next, the semiconductor film is processed into a desired shape using a mask. In this embodiment, after an oxide film formed over the semiconductor film is removed, another oxide film is formed. Then, a photomask is formed, and semiconductor layers 303, 304, 305, and 306 are formed by processing using a photolithography method. The semiconductor layers may have inclination angles (taper angles) at their end portions.

Either plasma etching (dry etching) or wet etching may be employed for etching treatment. Plasma etching is more suitable for processing a large-sized substrate. As an etching gas, a gas containing fluorine such as $CF_4$ or $NF_3$, or a gas containing chlorine such as $Cl_2$ or $BCl_3$ may be used, and an inert gas such as He or Ar may be added thereto as appropriate. Further, if etching treatment by atmospheric pressure discharge is employed, local electric discharge processing can also be realized, and in that case, a mask does not need to be formed on the entire surface of the substrate.

An insulating film 310 is formed over the semiconductor layer 305. The insulating film 310 may be formed using silicon oxide or with a layered structure of silicon oxide and silicon nitride. The insulating film 310 may be formed by deposition of an insulating layer by a plasma CVD method or a low pressure CVD method, and preferably, the insulating film 310 is formed by solid phase oxidation or solid phase nitridation by plasma treatment. This is because an insulating layer formed by oxidizing or nitriding a semiconductor layer (typically, a silicon layer) by plasma treatment is dense and has high withstand voltage and high reliability. Since the insulating film 310 is used as a tunnel insulating layer for injecting charges into a charge accumulation layer 311, the insulating film is preferably dense and has high withstand voltage and high reliability. The insulating film 310 is preferably formed to a thickness of 1 nm to 20 nm, more preferably 3 nm to 6 nm.

The insulating film 310 is preferably formed by plasma treatment in such a manner that, for example, a silicon oxide layer is formed to a thickness of 3 nm to 6 nm over the semiconductor layer by plasma treatment under an oxygen atmosphere, and then, a nitrogen plasma treated layer is formed by treating the surface of the silicon oxide layer with nitrogen plasma under a nitrogen atmosphere. Specifically, first, a silicon oxide layer with a thickness of 3 nm to 6 nm is formed over the semiconductor layer by plasma treatment under an oxygen atmosphere. Then, a nitrogen plasma treated layer with a high concentration of nitrogen is formed on the surface or near the surface of the silicon oxide layer by performing plasma treatment under a nitrogen atmosphere successively. Note that "near the surface" refers to a depth of approximately 0.5 nm to 1.5 nm from the surface of the silicon oxide layer. For example, when plasma treatment is performed in a nitrogen atmosphere, a structure is obtained in which the silicon oxide layer contains 20 atomic % to 50 atomic % nitrogen at a depth of approximately 1 nm from its surface.

A surface of a silicon layer as a typical example of the semiconductor layer is oxidized by plasma treatment, whereby a dense oxide layer that has no distortion at an interface can be formed. Further, by nitriding the oxide layer with plasma treatment so that oxygen at the outermost surface of the oxide layer is substituted for nitrogen to form a nitride layer, the layer can be further densified. Accordingly, an insulating layer with high withstand voltage can be formed.

In any case, by the solid phase oxidation or solid phase nitridation with the above plasma treatment, even if a glass substrate with an upper temperature limit of 700° C. or less is used, an insulating layer which is equivalent to a thermal oxide film formed at a temperature of 950° C. to 1050° C. can be obtained. Thus, a highly reliable tunnel insulating layer can be formed as the tunnel insulating layer of a nonvolatile memory element.

The charge accumulation layer 311 is fowled over the insulating film 310. The charge accumulation layer 311 may be a single layer or a stack of a plurality of layers.

The charge accumulation layer 311 can be a floating gate formed using a layer or particles of a semiconductor material or a conductive material. Examples of the semiconductor material are silicon and silicon germanium. When silicon is used, amorphous silicon or polysilicon can be used. Alternatively, polysilicon doped with phosphorus can be used. As the conductive material, an element selected from tantalum (Ta), titanium (Ti), molybdenum (Mo), or tungsten (W); an alloy containing the above element as its main component; an alloy film in which the above elements are combined (typically, an Mo—W alloy film or an Mo—Ta alloy film); or a silicon film provided with conductivity can be used. Under the conductive layer formed of such a material, nitride such as tantalum nitride, tungsten nitride, titanium nitride, or molybdenum nitride; or silicide such as tungsten silicide, titanium silicide, or molybdenum silicide may be formed. Further, a layered structure including the semiconductor materials, the conductive materials, or a combination of the semiconductor material and the conductive material may be employed. For example, a layered structure of a silicon layer and a germanium layer may be used.

Alternatively, an insulating layer having a trap which holds charges may be formed as the charge accumulation layer 311. Typical examples of a material for such a layer are a silicon compound and a germanium compound. Examples of the silicon compound are silicon nitride, silicon oxynitride, and silicon oxynitride to which hydrogen is added. Examples of the germanium compound are germanium nitride, germanium nitride to which oxygen is added, germanium oxide to which nitrogen is added, germanium nitride to which oxygen and hydrogen are added, and germanium oxide to which nitrogen and hydrogen are added.

Next, masks for covering the semiconductor layers 303, 304, and 306 are formed. An impurity element imparting n-type conductivity is added using the masks and the charge accumulation layer 311 as masks, so that n-type impurity regions 362a and 362b are formed. In this embodiment, phosphorus (P) which imparts n-type conductivity is used as the impurity element. Here, the impurity element imparting n-type conductivity is added so that the impurity element is contained in the n-type impurity regions 362a and 362b at a concentration of approximately $1\times10^{17}/cm^3$ to $5\times10^{18}/cm^3$. The masks covering the semiconductor layers 303, 304, and 306 are removed.

The oxide film over the semiconductor layer 306 is removed, and a gate insulating layer 309 which covers the semiconductor layer 305, the semiconductor layer 306, the insulating film 310, and the charge accumulation layer 311 is formed. When the gate insulating layer 309 is thick in the memory cell array, a thin film transistor and a memory element can have high resistance to high voltage, and thus, the reliability can be improved.

Note that although the gate insulating layer 309 formed above the semiconductor layer 305 functions as a control insulating layer in the memory element which is to be completed later, the gate insulating layer 309 functions as a gate insulating layer in a thin film transistor formed by using the semiconductor layer 306; therefore, the layer is referred to as the gate insulating layer 309 in this specification.

The oxide films over the semiconductor layers 303 and 304 are removed, and a gate insulating layer 308 which covers the semiconductor layers 303 and 304 is formed (see FIG. 6A). The gate insulating layer 308 can be formed by a plasma CVD method, a sputtering method, or the like. The gate insulating layer 308 of the thin film transistor provided in the driver circuit portion preferably has a thickness of 1 nm to 10 nm, more preferably approximately 5 nm. When the thickness of the gate insulating layer 308 is reduced, the transistor in the driver circuit portion can operate at high speed with low voltage.

The gate insulating layer 308 may be formed of silicon oxide or a stack of silicon oxide and silicon nitride. The gate insulating layer 308 may be formed by deposition of an insulating film by a plasma CVD method or a low pressure CVD method or may be formed by solid phase oxidation or solid phase nitridation by plasma treatment. This is because a gate insulating layer formed by oxidation or nitridation of a semiconductor layer by plasma treatment is dense and has high withstand voltage and high reliability.

Alternatively, a high dielectric constant material may be used for the gate insulating layer 308. When a high dielectric constant material is used for the gate insulating layer 308, the gate leakage current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

Further, a thin silicon oxide film can also be formed by oxidation of the surface of the semiconductor region by a GRTA method, an LRTA method, or the like, so that a thermal oxide film is formed. Note that in order to form a dense insulating film with little gate leakage current at a low film formation temperature, a rare gas element such as argon is preferably contained in a reactive gas so that the rare gas element can be mixed into the insulating film to be formed.

Then, a first conductive film having a thickness of 20 nm to 100 nm and a second conductive film having a thickness of 100 nm to 400 nm, each of which serves as a gate electrode layer, are stacked over the gate insulating layers 308 and 309. The first and second conductive films can be formed by a sputtering method, an evaporation method, a CVD method, or the like. Each of the first conductive film and the second conductive film may be formed of an element selected from tantalum (Ta), tungsten (W), titanium (Ti), molybdenum (Mo), aluminum (Al), copper (Cu), chromium (Cr), or neodymium (Nd), or an alloy material or a compound material containing the element as its main component. Alternatively, a semiconductor film typified by a polycrystalline silicon film doped with an impurity element such as phosphorus or an AgPdCu alloy may be used as the first conductive film and the second conductive film. Further, the structure is not limited to a two-layer structure, and a three-layer structure may be employed in which, for example, a 50-nm-thick tungsten film, a 500-nm-thick aluminum-silicon (Al—Si) alloy film, and a 30-nm-thick titanium nitride film are sequentially stacked as first, second, and third conductive films. In the case of employing the three-layer structure, tungsten nitride can be used instead of tungsten for the first conductive film. An aluminum-titanium alloy (Al—Ti) film may be used instead of the aluminum-silicon (Al—Si) alloy film for the second conductive film. Moreover, a titanium film may be used instead of the titanium nitride film for the third conductive film. Alternatively, a single-layer structure may be employed. In this embodiment, tantalum nitride is formed to a thickness of 30 nm for the first conductive film, and tungsten (W) is formed to a thickness of 370 nm for the second conductive film.

The first conductive film and the second conductive film are etched, so that first gate electrode layers 312, 313, and 314, second gate electrode layers 316, 317, and 318, a first control gate electrode layer 315, and a second control gate electrode layer 319 are formed (see FIG. 6B).

In this embodiment, an example is described in which the first gate electrode layer and the second gate electrode layer (the first control gate electrode layer and the second control gate electrode layer) are formed to have perpendicular side surfaces; however, one embodiment of the present invention is not limited thereto. Both the first gate electrode layer and the second gate electrode layer (the first control gate electrode layer and the second control gate electrode layer) may have a tapered shape. Alternatively, only one of the gate electrode layers (the first control gate electrode layer and the second control gate electrode layer) may have a tapered shape and the other may have a perpendicular side surface by anisotropic etching. The taper angles may be different or the same between the stacked gate electrode layers. When the gate electrode layer is tapered, coverage with a film which is stacked thereover is improved and defects are reduced; accordingly, the reliability is improved.

The gate insulating layers 308 and 309 may be etched to some extent and thinned (so-called film reduction) by the etching step in forming the gate electrode layers (and the control gate electrode layers).

Next, a mask 321 which covers the semiconductor layers 304 and a mask 363 which covers the semiconductor layers 305 and 306 are formed. An impurity element 320 that imparts p-type conductivity is added using the masks 321 and 363, the first gate electrode layer 312, and the second gate electrode layer 316 as masks, so that p-type impurity regions 322a and 322b are formed. In this embodiment, boron (B) is used as the impurity element. Here, the impurity element imparting p-type conductivity is added so that the p-type impurity regions 322a and 322b contain the impurity element at a concentration of approximately $1\times10^{20}$ atoms/cm$^3$ to $5\times10^{21}$ atoms/cm$^3$. Moreover, a channel formation region 323 is formed in the semiconductor layer 303 (see FIG. 6C).

The p-type impurity regions 322a and 322b are high-concentration p-type impurity regions and function as a source region and a drain region.

Next, a mask 325 which covers the semiconductor layer 303 is formed. An impurity element 324 that imparts n-type conductivity is added using the mask 325, the first gate electrode layer 313, the second gate electrode layer 317, the first gate electrode layer 314, the second gate electrode layer 318, the first control gate electrode layer 315, and the second control gate electrode layer 319 as masks, so that n-type impurity regions 326a, 326b, 364a, 364b, 327a, 327b, 328a, and 328b are formed. In this embodiment, phosphorus (P) is used as the impurity element. Here, the impurity element imparting n-type conductivity is added so that the n-type impurity regions 326a, 326b, 327a, 327b, 328a, and 328b contain the impurity element at a concentration of approximately $5\times10^{19}$ atoms/cm$^3$ to $5\times10^{20}$ atoms/cm$^3$. Moreover, a channel formation region 329 is formed in the semiconductor layer 304, a channel formation region 330 is formed in the semiconductor layer 305, and a channel formation region 331 is formed in the semiconductor layer 306 (see FIG. 6D).

The n-type impurity regions 326a, 326b, 327a, 327b, 328a, and 328b are high-concentration n-type impurity regions and function as a source region and a drain region. On the other hand, the n-type impurity regions 364a and 364b are low-concentration impurity regions and serve as LDD regions.

The mask 325 is removed by $O_2$ ashing or with a resist stripper, and an oxide film is also removed. After that, insulating films, that is, so-called sidewalls may be formed so as to cover the side surfaces of the gate electrode layers. The sidewall can be formed of an insulating film containing silicon by a plasma CVD method or a low pressure CVD (LPCVD) method.

In order to activate the impurity element, heat treatment, strong light irradiation, or laser light irradiation may be performed. At the same time as the activation, plasma damage to the gate insulating layer and to an interface between the gate insulating layer and the semiconductor layer can be reduced.

Next, an interlayer insulating layer which covers the gate insulating layer and the gate electrode layer is formed. In this embodiment, a layered structure of an insulating film 367 and an insulating film 368 is used. Each of the insulating films 367 and 368 may be a silicon nitride film, a silicon nitride oxide film, a silicon oxynitride film, or a silicon oxide film formed by a sputtering method or plasma CVD. Alternatively, a single-layer structure or a layered structure of three or more layers using another insulating film containing silicon may be employed.

Further, heat treatment is performed in a nitrogen atmosphere at 300° C. to 550° C. for 1 to 12 hours to hydrogenate the semiconductor layer. This step is preferably performed at 400° C. to 500° C. This step is a step for terminating a dangling bond in the semiconductor layer with hydrogen contained in the insulating film 367 which is the interlayer insulating layer. In this embodiment, the heat treatment is performed at 410° C. for 1 hour.

The insulating films 367 and 368 can be formed using a material selected from aluminum nitride, aluminum oxynitride, aluminum nitride oxide containing more nitrogen than oxygen, aluminum oxide, diamond-like carbon (DLC), nitrogen-containing carbon (CN), or another substance containing an inorganic insulating material. Alternatively, a siloxane resin may be used. Note that the siloxane resin corresponds to a resin having Si—O—Si bonding.

Next, using a resist mask, contact holes (opening portions) that reach the semiconductor layers are formed in the insulating films 367 and 368 and the gate insulating layers 308 and 309. Etching may be performed once or a plurality of times depending on the selectivity of materials which are used. Etching is performed to remove the insulating films 368 and 367 and the gate insulating layers 308 and 309, so that opening portions that reach the p-type impurity regions 322a and 322b which are the source region and the drain region, and opening portions that reach the n-type impurity regions 326a, 326b, 327a, 327b, 328a, and 328b which are the source region and the drain region are formed. For the etching, either wet etching or dry etching may be performed, or both wet etching and dry etching may be performed. An etchant for wet etching is preferably a hydrofluoric acid-based solution such as a mixture solution containing ammonium hydrogen fluoride and ammonium fluoride. As an etching gas, a chlorine based gas typified by $Cl_2$, $BCl_3$, $SiCl_4$, $CCl_4$, or the like, a fluorine based gas typified by $CF_4$, $SF_6$, $NF_3$, or the like, or $O_2$ can be used as appropriate. Further, an inert gas may be added to an etching gas to be used. As an inert element to be added, one or a plurality of elements selected from He, Ne, Ar, Kr, or Xe can be used.

A conductive film is formed so as to cover the opening portions, and the conductive film is etched to form wiring layers 369a, 369b, 370a, 370b, 371a, 371b, 372a, and 372b each of which is a source electrode layer or a drain electrode layer electrically connected to part of its respective source region or drain region. The wiring layers can be formed in such a manner that the conductive film is formed by a PVD method, a CVD method, an evaporation method, or the like, and then, the conductive film is etched into a desired shape. Alternatively, the conductive layer can be selectively formed at a predetermined position by a droplet discharging method, a printing method, an electrolytic plating method, or the like. Further, a reflow method or a damascene method may be used. As a material for the source electrode layer and the drain electrode layer, a metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof is used. Alternatively, a layered structure of these materials may be used. In this embodiment, a 60-nm-thick titanium (Ti) film, a 40-nm-thick titanium nitride film, a 700-nm-thick aluminum film, and a 200-nm-thick titanium (Ti) film are formed so that a layered structure is formed, and then the stacked film is processed into a desired shape.

Through the above steps, a semiconductor integrated circuit 350 including a thin film transistor 373 which is a p-channel thin film transistor including the p-type impurity region; a thin film transistor 374 which is an n-channel thin film transistor including the n-type impurity region; a memory element 375 including the n-type impurity region as the memory cell array; and a thin film transistor 376 which is an n-channel thin film transistor including the n-type impurity region can be manufactured as the driver circuit portion (see FIG. 6E).

In this embodiment, an insulating layer 390 is formed over the semiconductor integrated circuit 350 (see FIG. 7A). Then, as a first insulator 382, a structure body in which a fibrous body 383 is impregnated with an organic resin 384 is used. The structure body is heated and subjected to pressure bonding so that the semiconductor integrated circuit 350, the first insulator 382, and a fourth insulator 391 are bonded, and the semiconductor integrated circuit 350 is separated from the substrate 300 along the separation layer 301. Accordingly, the semiconductor integrated circuit 350 is provided on the first insulator 382 side (see FIG. 7B).

Like the first insulator 382, a structure body in which the fibrous body 383 is impregnated with the organic resin 384 is used as a second insulator 385. The structure body is heated and subjected to pressure bonding so that a third insulator 388 and the second insulator 385 are bonded to each other. A bonding layer 389 is provided on a surface of the second insulator 385, which is opposite to the side where the third insulator 388 is provided.

Figures 8A, 8B:
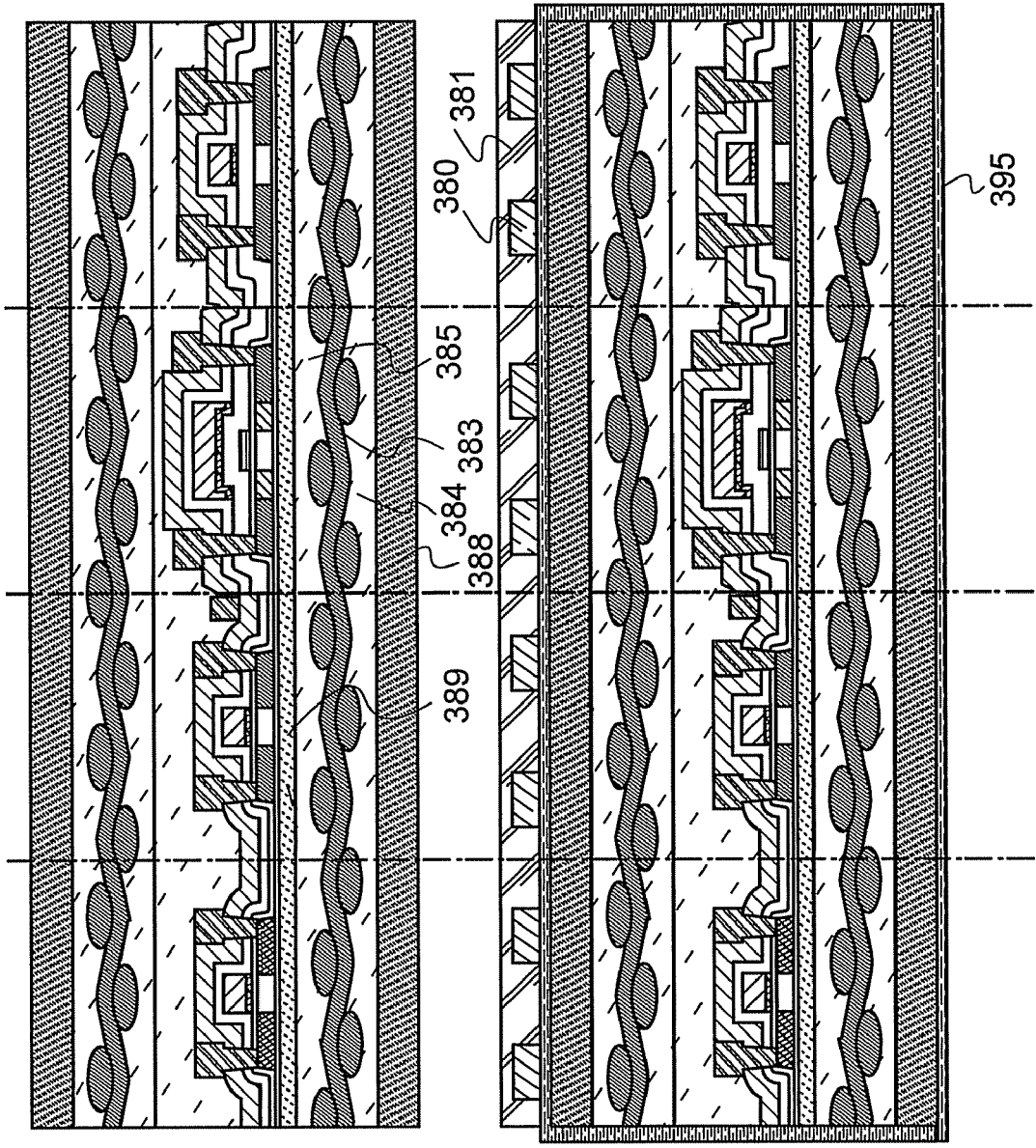
FIGS. 8A and 8B illustrate a method for manufacturing a semiconductor device in one embodiment of the present invention.

The bonding layer 389 is bonded to an exposed separation surface of the semiconductor integrated circuit 350, so that the semiconductor integrated circuit 350 is sandwiched between the fourth insulator 391 and the first insulator 382; and the third insulator 388 and the second insulator 385 (see FIG. 8A).

Although not illustrated, the first insulator 382 and the second insulator 385 sandwich a plurality of semiconductor integrated circuits 350 so as to be arranged in a plane direction. The plurality of the semiconductor integrated circuits 350 are cut into individual semiconductor integrated circuits to manufacture semiconductor integrated circuit chips. The semiconductor integrated circuits 350 are cut by laser light irradiation in this embodiment; however, a cutting means is not particularly limited as long as the semiconductor integrated circuits 350 can be physically cut off.

By the cutting, at the cut surface, the first insulator 382 and the second insulator 385 are melted and fused together, and the third insulator 388 and the fourth insulator 391 are melted and fused together. Accordingly, the semiconductor integrated circuit 350 is sealed with the first insulator 382 and the second insulator 385 and with the third insulator 388 and the fourth insulator 391.

Next, a conductive shield 395 is formed so as to cover (surround) the third insulator 388 and the fourth insulator

391. First, a conductive shield is formed on the surface and the cut surface of the third insulator 388, and a conductive shield is formed on the surface and the cut surface of the fourth insulator 391 (see FIG. 8B). In this embodiment, as the conductive shield 395, a titanium film with a thickness of 10 nm (preferably greater than or equal to 5 nm and less than or equal to 100 nm) is formed by a sputtering method.

After that, a conductive layer 380 that functions as an antenna is formed over the conductive shield 395, and an inorganic insulating layer 381 is formed over the conductive layer 380 as a protective layer. In this embodiment, a silicon nitride film is formed as the inorganic insulating layer 381. The conductive layer 380 is electrically connected to the semiconductor integrated circuit 350 through a contact hole provided in the conductive shield 395, the third insulator, and the first insulator. As has been described in Embodiment 1, although not illustrated, an insulating layer may be provided so that the conductive shield and the antenna are not in direct contact with each other.

The thus formed semiconductor integrated circuit 350 is sealed with the first insulator 382, the second insulator 385, the third insulator 388, and the fourth insulator 391. Moreover, the semiconductor integrated circuit 350 has a structure where the semiconductor integrated circuit 350 is protected from electrostatic discharge by the conductive shield 395 provided on the external side and the cut surface of the third insulator 388 and the fourth insulator 391, which correspond to the top surface and the back surface of a semiconductor device.

The conductive shield 395 does not interfere with electromagnetic waves that should be sent and received by the conductive layer 380 which is the antenna included in the semiconductor device, and blocks static electricity applied from the outside to the semiconductor integrated circuit 350 in the semiconductor device. The conductive shield 395 diffuses static electricity applied by electrostatic discharge to let it go or prevents local electric charge (localization of electric charge) (i.e., prevents local potential difference), so that electrostatic breakdown of the semiconductor integrated circuit 350 can be prevented.

Since the insulators are provided so as to sandwich the semiconductor integrated circuit, adverse effects of external stress or electrostatic discharge on the semiconductor integrated circuit, such as damage or deterioration in characteristics, can be prevented in a manufacturing process. Thus, the semiconductor device can be manufactured with high yield.

As described above, by the conductive shield which covers the semiconductor integrated circuit, electrostatic breakdown (malfunction of the circuit or damage to a semiconductor element) of the semiconductor integrated circuit due to electrostatic discharge can be prevented. Moreover, with the use of a pair of insulators which sandwich the semiconductor integrated circuit, a thin and small semiconductor device that has resistance properties and high reliability can be provided. Further, shape defects and defective characteristics which are caused by external stress or electrostatic discharge are prevented in the manufacturing process, so that a semiconductor device can be manufactured with high yield.

When a flexible insulator is used, the semiconductor device manufactured in this embodiment can have flexibility.

[Embodiment 4]

In this embodiment, an example of a semiconductor device for achieving higher reliability will be described. Specifically, as an example of the semiconductor device, examples of a microprocessor and a semiconductor device that has an arithmetic function and can send and receive data without contact will be described.

Figure 9:
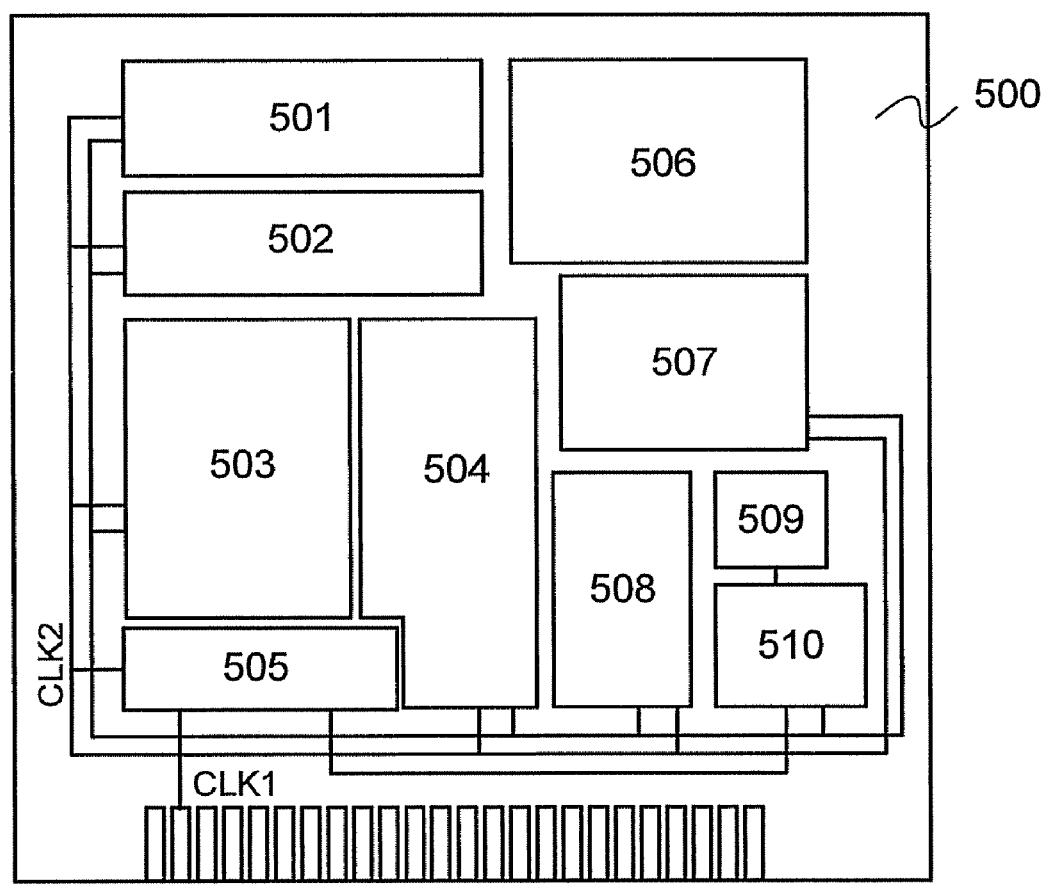
FIG. 9 illustrates a structure of a microprocessor which is an example of a semiconductor device in one embodiment of the present invention.

FIG. 9 illustrates an example of a microprocessor 500 as an example of the semiconductor device. This microprocessor 500 is formed using the semiconductor device formed according to the above Embodiments. The microprocessor 500 includes an arithmetic logic unit 501 (also referred to as an ALU), an ALU controller 502, an instruction decoder 503, an interrupt controller 504, a timing controller 505, a register 506, a register controller 507, a bus interface (a bus I/F) 508, a read only memory 509, and a memory interface (a ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads and writes data from and to the register 506 in accordance with the state of the microprocessor 500. The timing controller 505 generates signals for controlling timing of the operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the internal clock signal CLK2 to the above circuits. Note that FIG. 9 illustrates a mere example of the simplified structure of the microprocessor 500, and a practical microprocessor can have various structures depending on the application.

Figure 10:
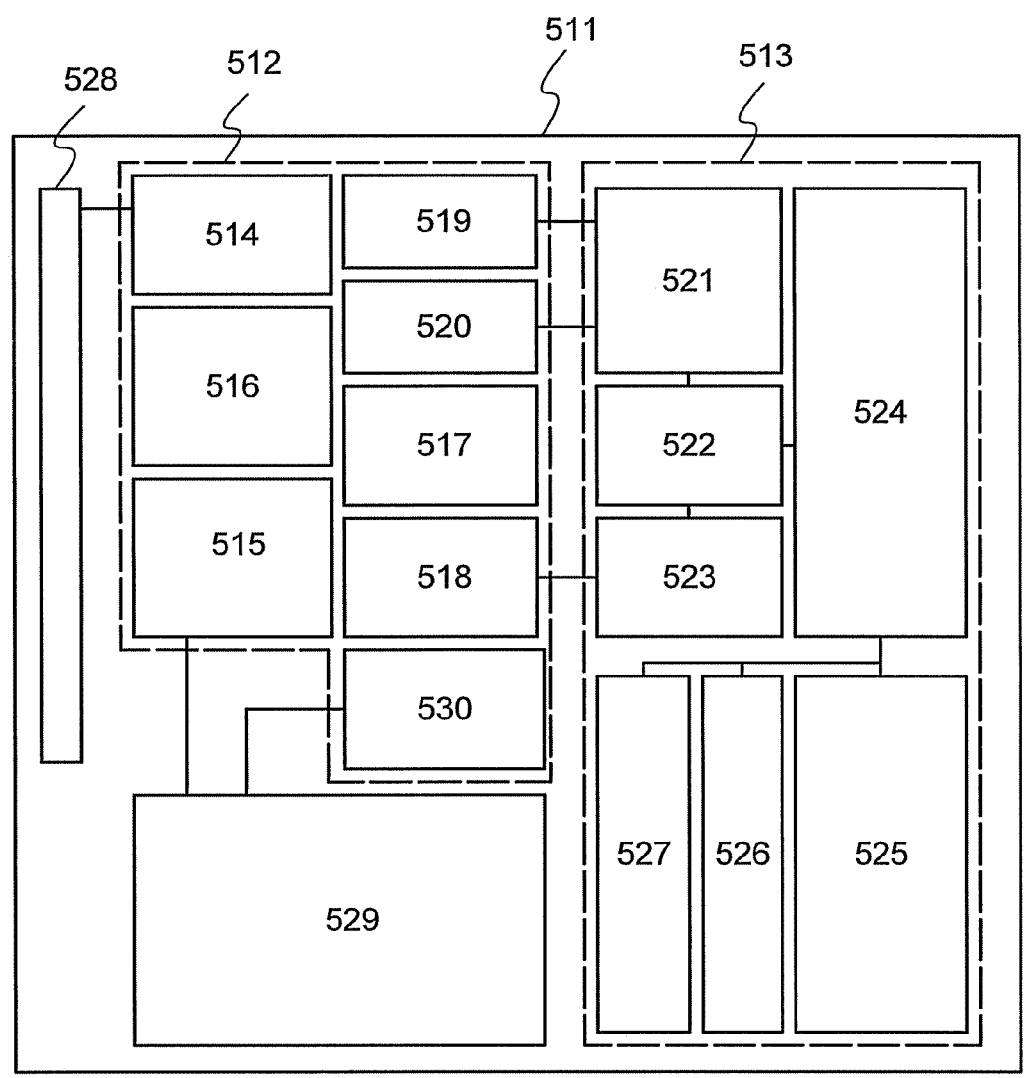
FIG. 10 illustrates a structure of a microprocessor which is an example of a semiconductor device in one embodiment of the present invention.

Next, an example of a semiconductor device that has an arithmetic function and can send and receive data without contact will be described with reference to FIG. 10. FIG. 10 illustrates an example of a computer that operates to send and receive signals to and from an external device by wireless communication (such a computer is hereinafter referred to as an RFCPU). An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure will be described below. The resonance circuit 514 generates induced electromotive force based on a signal received by an antenna 528. The induced electromotive force is stored in a capacitor portion 529 through the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface where the RFCPU 511 is formed.

The reset circuit 517 generates a signal that resets the digital circuit portion 513 to be initialized. For example, the reset circuit 517 generates a signal which rises with delay after increase in power supply voltage as a reset signal. The oscillator circuit 518 changes the frequency and the duty ratio of a clock signal in accordance with a control signal generated by the constant voltage circuit 516. The demodulation circuit 519 including a low pass filter binarizes change in amplitude of reception signals of an amplitude shift keying (ASK) system, for example. The modulation circuit 520 changes the amplitude of transmission signals of an amplitude shift keying (ASK) system to be sent. The modulation circuit 520 changes the resonance point of the resonance circuit 514, thereby changing the amplitude of communication signals. The clock controller 523 generates a control signal for changing the frequency and the duty ratio of the clock signal in accordance with the power supply voltage or current consumption in the central processing unit 525. The power supply voltage is monitored by a power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the CPU interface 524. The CPU interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an operating system (OS) and a program is read and executed at the time of starting operation. Alternatively, a method in which a circuit dedicated to arithmetic is formed and arithmetic process is conducted using hardware may be employed. In a method in which both hardware and software are used, a method can be employed in which part of process is conducted in the circuit dedicated to arithmetic and the other part of the arithmetic process is conducted by the central processing unit 525 using a program.

In the microprocessor in this embodiment, electrostatic breakdown (malfunction of the circuit or damage to a semiconductor element) of the semiconductor integrated circuit due to electrostatic discharge is prevented by the conductive shield which covers the semiconductor integrated circuit. Moreover, with the use of a pair of insulators which sandwich the semiconductor integrated circuit, a thin and small semiconductor device that has resistance properties and high reliability can be provided. Further, shape defects and defective characteristics which are caused by external stress or electrostatic discharge are prevented in the manufacturing process, so that a semiconductor device can be manufactured with high yield.

[Embodiment 5]

In this embodiment, examples of usage modes of the semiconductor device shown in the above Embodiments will be described. Specifically, an application example of a semiconductor device that can input and output data without contact is described below with reference to drawings. The semiconductor device that can input and output data without contact is also referred to as an RFID tag, an ID tag, an IC tag, an RF tag, a wireless tag, an electronic tag, or a wireless chip depending on usage modes.

An example of a top surface structure of a semiconductor device shown in this embodiment is described with reference to FIG. 11A. The semiconductor device illustrated in FIG. 11A includes a semiconductor integrated circuit chip 400 and a support substrate 406 provided with an antenna 405. The semiconductor integrated circuit chip 400 is attached to the support substrate 406 so that a terminal of the semiconductor integrated circuit chip 400 and a terminal of the antenna 405 are electrically connected to each other at a contact point 407 (see FIG. 11B).

A semiconductor integrated circuit provided in the semiconductor integrated circuit chip 400 is provided with elements such as a plurality of transistors included in a memory portion or a logic portion. A memory element including a semiconductor layer as well as a semiconductor element such as a field-effect transistor can be applied to the semiconductor device according to this embodiment. Accordingly, a semiconductor device which can meet functions required for various applications can be manufactured and provided.

Next, structures and arrangement of the semiconductor integrated circuit chip 400 and the antenna 405 will be described. FIG. 11B is a perspective view of a semiconductor device in which the semiconductor integrated circuit chip 400 and the antenna 405 provided for the support substrate 406 which are illustrated in FIG. 11A are stacked. FIG. 11C is a cross-sectional view along the dashed line X-Y of FIG. 11B.

As the semiconductor integrated circuit 100 illustrated in FIG. 11C, the semiconductor integrated circuit shown in Embodiments 1 to 4 can be used. Here, a chip obtained by cutting the semiconductor integrated circuits into individual chips is referred to as the semiconductor integrated circuit chip 400. Note that although the semiconductor integrated circuit chip 400 illustrated in FIG. 11C is an example of using Embodiment 1, this embodiment can be applied to another embodiment and is not limited to this structure.

The semiconductor integrated circuit 100 illustrated in FIG. 11C is sandwiched between the first insulator 112 and the second insulator 102, and side surfaces of the semiconductor integrated circuit 100 is also sealed with the first insulator 112 and the second insulator 102. In this embodiment, the first insulator and the second insulator are attached so as to sandwich a plurality of semiconductor integrated circuits, and then the plurality of semiconductor integrated circuits are cut into individual semiconductor integrated circuits; accordingly, the semiconductor integrated circuit chips 400 are manufactured. The semiconductor integrated circuits 100 are cut by laser light irradiation in this embodiment; however, a cutting means is not particularly limited as long as the semiconductor integrated circuits 100 can be physically cut off.

The semiconductor device according to one embodiment of the present invention includes the conductive shields 140a and 140b on the external side (the side opposite to the side where the semiconductor integrated circuit is provided, and the side surface) of a pair of insulators sandwiching the antenna and the semiconductor integrated circuit which is electrically connected to the antenna. The conductive shields 140a and 140b transmit electromagnetic waves to be sent and received by the antenna included in the semiconductor device, and block static electricity applied from the outside to the semiconductor integrated circuit in the semiconductor device.

Figure 11A:
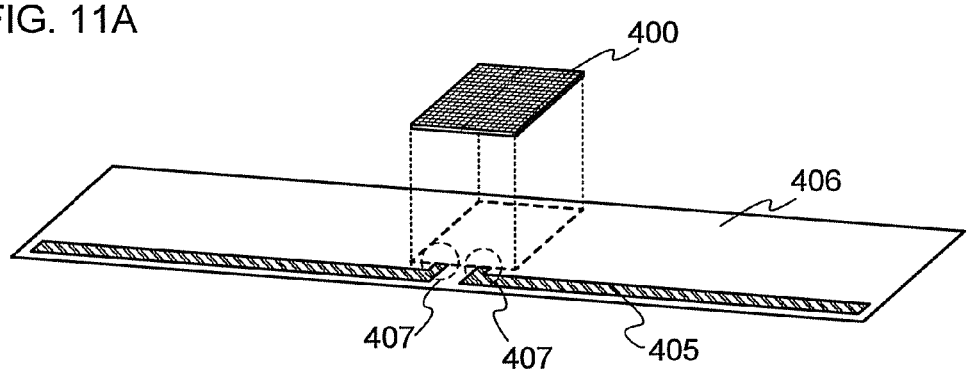
FIGS. 11A to 11C illustrate a method for manufacturing a semiconductor device in one embodiment of the present invention.
Figure 11B:
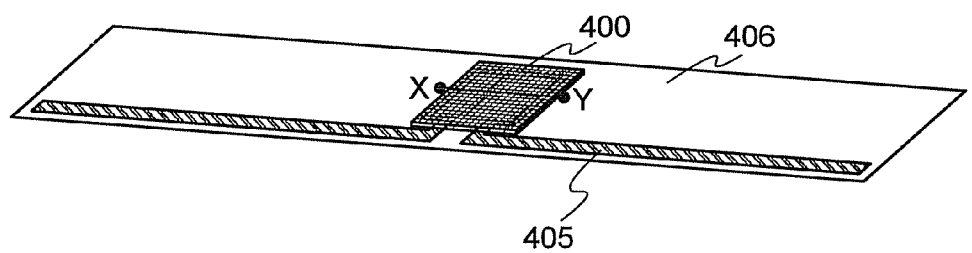
Figure 11C:
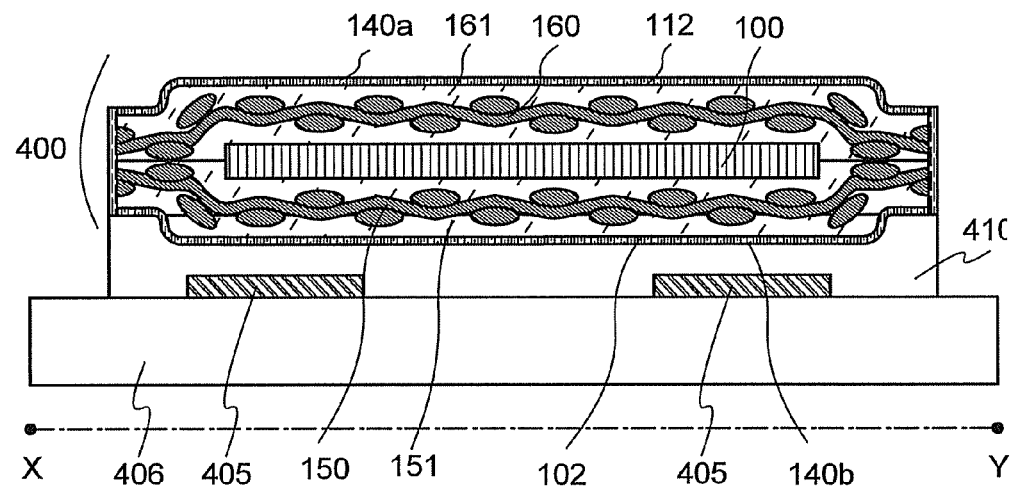
Figure 12A:
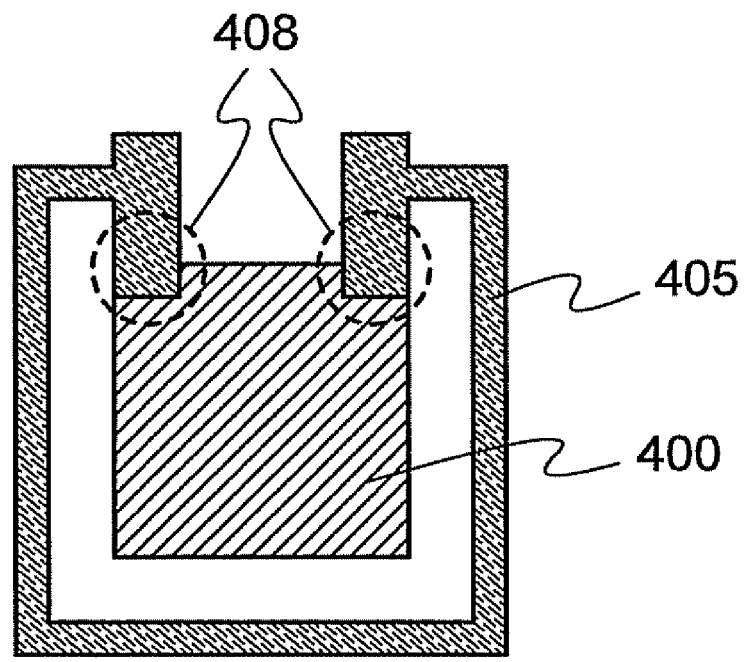
FIGS. 12A and 12B illustrate a method for manufacturing a semiconductor device in one embodiment of the present invention.

FIG. 12A is an enlarged view of the semiconductor integrated circuit chip 400 and the antenna which are illustrated in FIG. 11A. In FIG. 12A, the antenna is a rectangular loop antenna whose number of windings is one, but this embodiment is not limited to this structure. The shape of the antenna is not limited to a rectangle, and may be a shape with a curve, for example, a circular shape. Moreover, the number of windings is not limited to one, and may be plural. Note that in the case where the number of windings of the antenna is one, parasitic capacitance generated between the semiconductor integrated circuit chip 400 and the antenna 405 can be reduced.

Figure 12B:
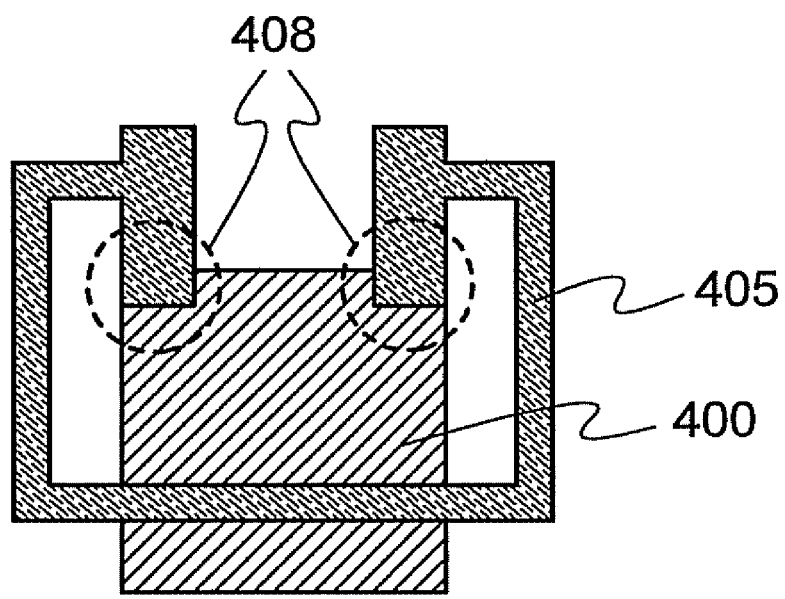

In FIG. 11A and FIG. 12A, the antenna 405 is arranged so as to surround the periphery of the semiconductor integrated circuit chips 400, and the antenna 405 is arranged in a region different from a region where the semiconductor integrated circuit chip 400 is provided, except portions corresponding to contact points 408 indicated by dashed lines. However, one embodiment of the present invention is not limited to this structure. As illustrated in FIG. 12B, the antenna 405 may be arranged so as to overlap with at least part of the semiconductor integrated circuit chip 400 other than the portions corresponding to the contact points 408 indicated by the dashed lines. Note that when the antenna 405 is arranged in a region different from the region where the semiconductor circuit chip 400 is provided as illustrated in FIG. 11A and FIG. 12A, parasitic capacitance generated between the semiconductor integrated circuit chip 400 and the antenna 405 can be reduced.

To the semiconductor device which is one embodiment of the present invention, an electromagnetic induction method, an electromagnetic coupling method, or a microwave method can be applied. In the case of the microwave method, the shape of the antenna 405 may be determined as appropriate depending on the wavelength of an electromagnetic wave to be used.

For example, when a microwave method (e.g., a UHF band (860 MHz to 960 MHz band) or a 2.45 GHz band) is employed as the signal transmission method for the semiconductor device, the length, the shape, and the like of the antenna may be determined as appropriate in consideration of the wavelength of an electromagnetic wave used for signal transmission. For example, the antenna can be formed into a linear shape (e.g., a dipole antenna) or a flat shape (e.g., a patch antenna or an antenna having a ribbon shape). Further, the antenna is not limited to having a linear shape, and the antenna may have a curved shape, a meander shape, or a combination thereof in consideration of the wavelength of the electromagnetic wave.

In the semiconductor device to which one embodiment of the present invention is applied, electrostatic breakdown (malfunction of the circuit or damage to a semiconductor element) of the semiconductor integrated circuit due to electrostatic discharge is prevented by the conductive shield which covers the semiconductor integrated circuit. Moreover, with the use of a pair of insulators which sandwich the semiconductor integrated circuit, a thin and small semiconductor device that has resistance properties and high reliability can be provided. Further, shape defects and defective characteristics which are caused by external stress or electrostatic discharge are prevented in the manufacturing process, so that a semiconductor device can be manufactured with high yield. Accordingly, one embodiment of the present invention is effective in a small-sized semiconductor device that is capable of inputting and outputting data without contact as described in this embodiment. Since the semiconductor device in this embodiment has high reliability against external force, environmental conditions under which the semiconductor device can be used can be extended, and thus, the application range of the semiconductor device can be widened.

[Embodiment 6]

In this embodiment, an application example of a semiconductor device that is capable of inputting and outputting data without contact, which is formed using one embodiment of the present invention, will be described below with reference to the drawings. The semiconductor device that is capable of inputting and outputting data without contact is also referred to as an RFID tag, an ID tag, an IC tag, an IC chip, an RF tag, a wireless tag, an electronic tag, or a wireless chip depending on the application mode.

Figure 13A:
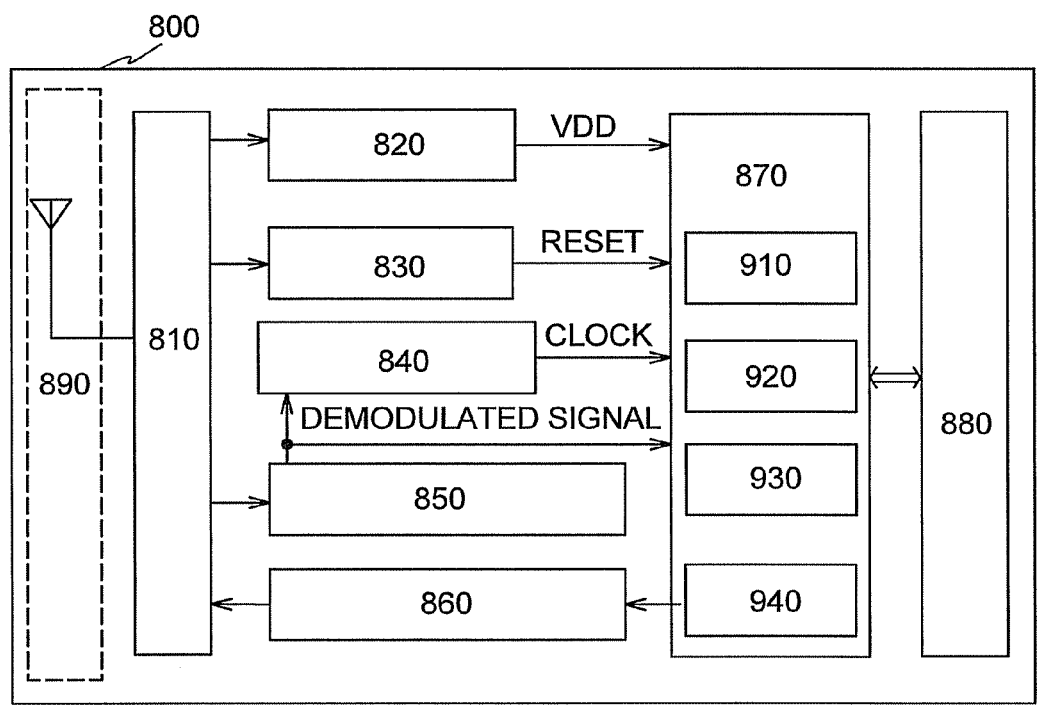
FIGS. 13A to 13C each illustrate an application example of a semiconductor device in one embodiment of the present invention.

A semiconductor device 800 illustrated in FIG. 13A has a function of communicating data without contact, and includes a high frequency circuit 810, a power supply circuit 820, a reset circuit 830, a clock generator circuit 840, a data demodulation circuit 850, a data modulation circuit 860, a control circuit 870 for controlling other circuits, a memory circuit 880, and an antenna 890. The high frequency circuit 810 receives a signal from the antenna 890 and outputs a signal, which is received from the data modulation circuit 860, from the antenna 890. The power supply circuit 820 generates a power supply potential from a received signal. The reset circuit 830 generates a reset signal. The clock generator circuit 840 generates a variety of clock signals based on a received signal input from the antenna 890. The data demodulation circuit 850 demodulates a received signal and outputs the demodulated signal to the control circuit 870. The data modulation circuit 860 modulates a signal received from the control circuit 870. For the control circuit 870, a code extracting circuit 910, a code judging circuit 920, a CRC judging circuit 930, and an output unit circuit 940 are provided, for example. Note that the code extracting circuit 910 extracts each of a plurality of codes included in an instruction sent to the control circuit 870. The code judging circuit 920 judges the content of the instruction by comparing the extracted code with a code corresponding to a reference. The CRC judging circuit 930 detects whether or not there is a transmission error or the like based on the judged code.

Next, an example of operation of the above semiconductor device will be explained. First, a wireless signal is received by the antenna 890. The wireless signal is sent to the power supply circuit 820 through the high frequency circuit 810, and a high power supply potential (hereinafter referred to as VDD) is generated. VDD is supplied to each circuit included in the semiconductor device 800. A signal sent to the data demodulation circuit 850 through the high frequency circuit 810 is demodulated (hereinafter, this signal is referred to as a demodulated signal). Moreover, signals passing through the reset circuit 830 and the clock generator circuit 840 via the high frequency circuit 810, and the demodulated signal are sent to the control circuit 870. The signals sent to the control circuit 870 are analyzed by the code extracting circuit 910, the code judging circuit 920, the CRC judging circuit 930, and the like. Then, information of the semiconductor device stored in the memory circuit 880 is output based on the analyzed signals. The output information of the semiconductor device is encoded through the output unit circuit 940. Further, the encoded information of the semiconductor device 800 passes through the data modulating circuit 860 and is sent by the antenna 890 as a wireless signal. Note that a low power supply potential (hereinafter referred to as VSS) is common in the plurality of circuits included in the semiconductor device 800, and VSS can be GND.

As described above, data in the semiconductor device 800 can be read in such a manner that a signal is sent from a communication device to the semiconductor device 800 and a signal which is sent from the semiconductor device 800 is received by the communication device.

Moreover, in the semiconductor device 800, a power supply voltage may be supplied to each circuit by electromagnetic waves without the provision of a power source (a battery), or a power source (a battery) may be provided so that a power supply voltage is supplied to each circuit by both electromagnetic waves and the power source (the battery).

Figure 13B:
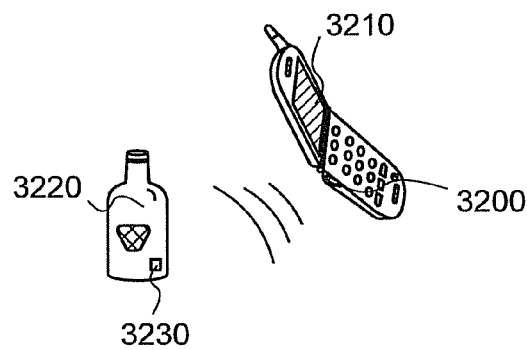
Figure 13C:
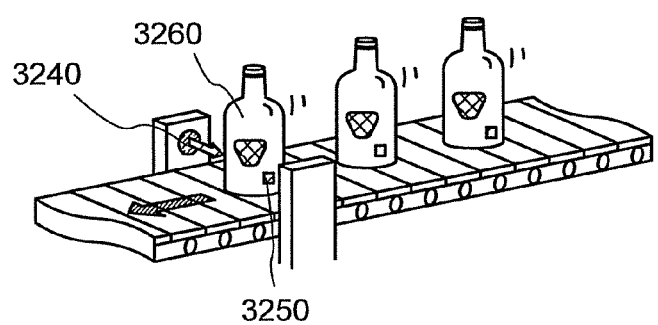
Figure 14A:
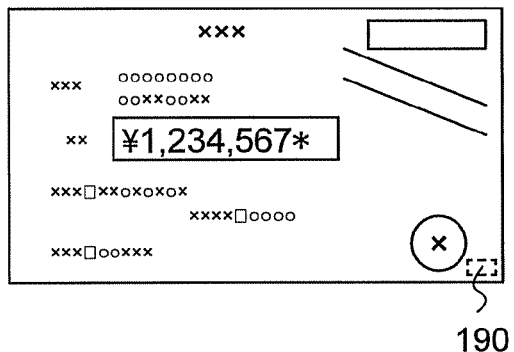
FIGS. 14A to 14G each illustrate an application example of a semiconductor device in one embodiment of the present invention.
Figure 14B:
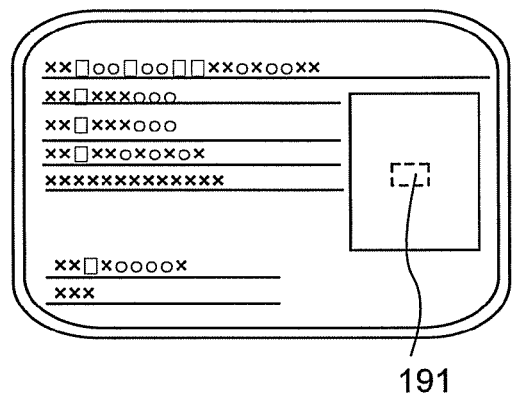
Figure 14C:
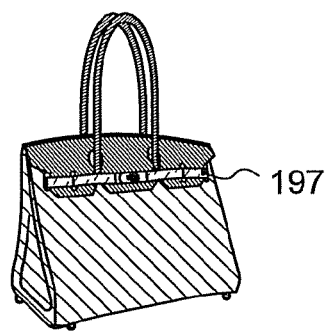
Figure 14D:
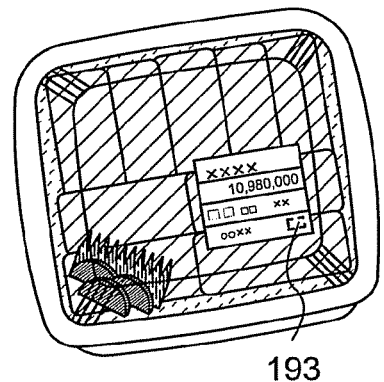
Figure 14E:
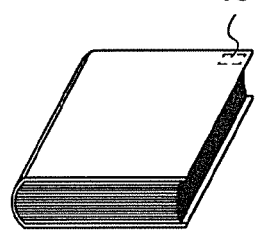
Figure 14F:
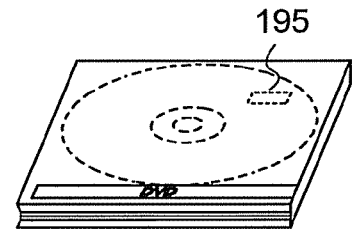
Figure 14G:
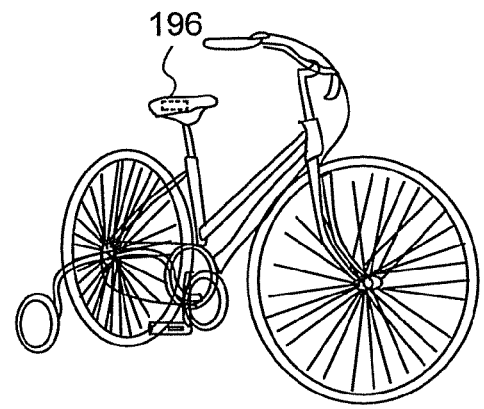

Next, an example of an application mode of the semiconductor device that can input and output data without contact will be described. A communication device 3200 is provided on a side surface of a mobile terminal including a display portion 3210, and a semiconductor device 3230 is provided on a side surface of a product 3220 (FIG. 13B). When the communication device 3200 is held over the semiconductor device 3230 included in the product 3220, the display portion 3210 displays information about the product such as its materials, its place of production, inspection results for each production step, a history of the distribution process, and description of the product. Further, when a product 3260 is conveyed by a conveyer belt, the product 3260 can be inspected using a communication device 3240 and a semiconductor device 3250 attached to the product 3260 (FIG. 13C). In such a manner, by utilizing a semiconductor device for a system, information can be easily obtained, and high functions and high added value are realized.

As described above, a highly reliable semiconductor device which is one embodiment of the present invention has a very wide range of application, and can be used in electronic devices in a variety of fields.

[Embodiment 7]

According to one embodiment of the present invention, a semiconductor device functioning as a chip including a processor circuit (hereinafter also referred to as a processor chip, a wireless chip, a wireless processor, a wireless memory, or a wireless tag) can be formed. An applicable range of the semiconductor device which is one embodiment of the present invention is wide, and the semiconductor device can be applied to any product as long as it clarifies information of an object, such as the history thereof, without contact and is useful for production, management, or the like. For example, the semiconductor device can be provided in bills, coins, securities, certificates, bearer bonds, packing containers, books, recording media, personal belongings, vehicles, groceries, garments, health products, daily commodities, medicines, and electronic devices. Examples of these products will be described with reference to FIGS. 14A to 14G.

The bills and coins are money that circulates in the market, and includes notes that can be used in the same way as money in a specific area (a cash voucher), a commemorative coin, and the like. The securities refer to checks, certificates, promissory notes, and the like and can be provided with a chip 190 including a processor circuit (see FIG. 14A). The certificates refer to driver's licenses, certificates of residence, and the like and can be provided with a chip 191 including a processor circuit (see FIG. 14B). The personal belongings refer to bags, a pair of glasses, and the like and can be provided with a chip 197 including a processor circuit (see FIG. 14C). The bearer bonds refer to stamps, rice coupons, a variety of merchandise coupons, and the like. The packing containers refer to wrapping paper for food containers and the like, plastic bottles, and the like and can be provided with a chip 193 including a processor circuit (see FIG. 14D). The books refer to books, documents, and the like and can be provided with a chip 194 including a processor circuit (see FIG. 14E). The recording media refer to DVD software, video tapes, and the like and can be provided with a chip 195 including a processor circuit (see FIG. 14F). The vehicles refer to wheeled cycles such as bicycles, vessels, and the like and can be provided with a chip 196 including a processor circuit (see FIG. 14G). The groceries indicate foods, beverages, and the like. The garments indicate clothes, shoes, and the like. The health products indicate medical apparatuses, health appliances, and the like. The daily commodities indicate furniture, lighting devices, and the like. The medicines indicate drugs, agricultural chemicals, and the like. The electronic devices indicate liquid crystal display devices, EL display devices, television sets (a television receiver and a thin television receiver), mobile phones, and the like.

The semiconductor device is provided by being attached to the surface of a product or being embedded in a product. For example, in the case of a book, the semiconductor device may be embedded in the paper; and in the case of a package made of an organic resin, the semiconductor device may be embedded in the organic resin.

As described above, by providing the semiconductor device on the packing containers, the recording media, the personal belonging, the groceries, the garments, the daily commodities, the electronic devices, and the like, the efficiency of an inspection system, a system used in a rental shop, or the like can be improved. Moreover, by providing the semiconductor device on the vehicles, forgery or theft can be prevented. Further, when the semiconductor device is implanted into creatures such as animals, each creature can be easily identified. For example, when the semiconductor device provided with a sensor is implanted into or attached to a creature such as livestock, its health condition such as a current body temperature as well as its birth year, sex, breed, or the like can be easily managed.

Note that this embodiment can be implemented in combination with any of Embodiments 1 to 6 and 8 as appropriate.

[Embodiment 8]

In this embodiment, an example of mounting a semiconductor device which is one embodiment of the present invention will be described with reference to FIGS. 15A to 15D.

The semiconductor device which is one embodiment of the present invention can be mounted on a variety of products as has been described in Embodiment 7. In this embodiment, an example in which the semiconductor device is mounted on a flexible substrate to manufacture a flexible semiconductor device is described.

Figure 15A:
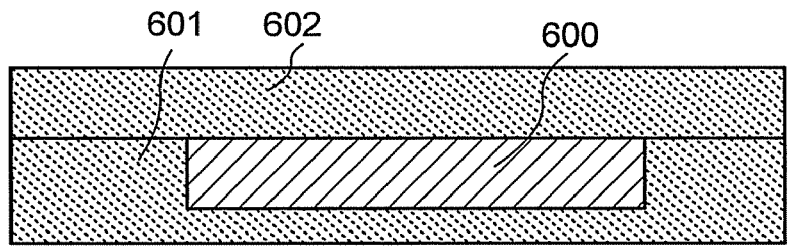
FIGS. 15A to 15D each illustrate a method for manufacturing a semiconductor device in one embodiment of the present invention.
Figure 15B:
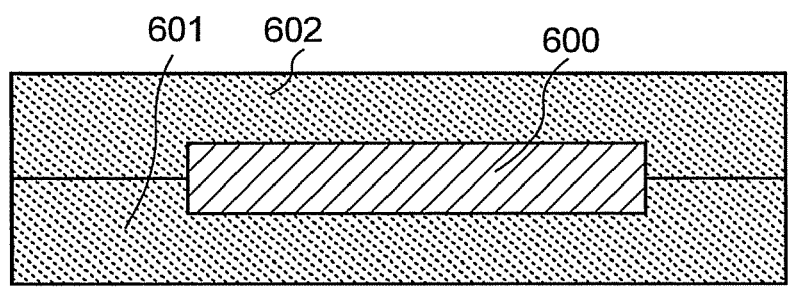
Figure 15C:
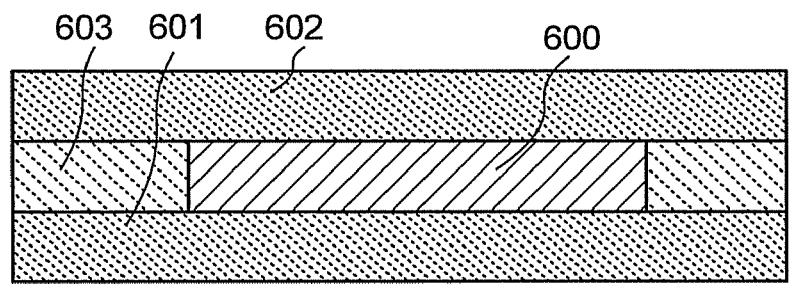
Figure 15D:
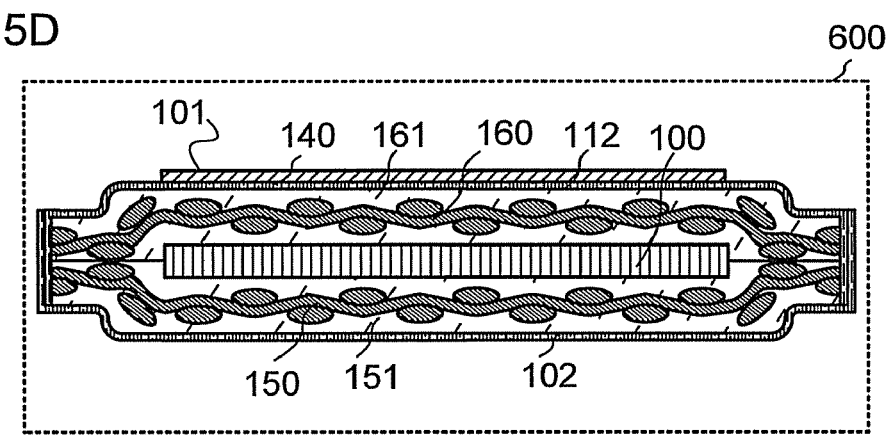

FIGS. 15A to 15C each illustrate an example in which a semiconductor integrated circuit chip is mounted so as to be embedded in a flexible substrate. Any of the semiconductor devices described in Embodiments 1 to 6 can be used for the semiconductor integrated circuit chip, and here, a chip obtained by cutting the semiconductor devices into individual chips is referred to as a semiconductor integrated circuit chip. FIG. 15D illustrates the detail of a semiconductor integrated circuit chip 600. The semiconductor integrated circuit chip illustrated in FIG. 15D is an example of using Embodiment 1; however, this embodiment can be applied to another embodiment and not limited to this structure.

As illustrated in FIG. 15D, the semiconductor integrated circuit 100 is sandwiched between the first insulator 112 and the second insulator 102, and side surfaces of the semiconductor integrated circuit 100 are also sealed. Although not particularly illustrated, the antenna 101 provided over the conductive shield and the semiconductor integrated circuit 100 are electrically connected to each other through a contact hole provided in the conductive shield and the insulator. In this embodiment, the first insulator 112 and the second insulator 102 sandwich a plurality of semiconductor integrated circuits. The antennas 101 and the semiconductor integrated circuits 100 are cut into individual antennas and semiconductor integrated circuits, and thus semiconductor integrated circuit chips are manufactured. The semiconductor integrated circuits are cut by laser light irradiation in this embodiment; however, a cutting means is not particularly limited as long as the semiconductor integrated circuits can be physically cut off. The semiconductor integrated circuits 100 are cut off, whereby the semiconductor integrated circuit 100 is sealed by the first insulator 112 and the second insulator 102. The first insulator 112 and the second insulator 102 are aligned with cut surfaces (side surfaces generated by the cutting), and the first insulator 112 and the second insulator 102 are exposed at the cut surfaces.

The conductive shield 140 is formed so as to cover (surround) the first insulator 112 and the second insulator 102. The conductive shield 140 is formed on the surface and the cut surface of the first insulator 112 and the second insulator 102. Accordingly, the antenna 101 and the semiconductor integrated circuit 100 have a structure where the antenna 101 and the semiconductor integrated circuit 100 are sealed by the first insulator 112 and the second insulator 102, and are protected from electrostatic discharge by the conductive shield 140 provided on the external side of the first insulator 112 and the second insulator 102, which corresponds to the top surface and the back surface of a semiconductor device.

Electrostatic breakdown (malfunction of the circuit or damage to a semiconductor element) of the semiconductor integrated circuit due to electrostatic discharge is prevented by the conductive shield which covers the semiconductor integrated circuit. Moreover, with the use of a pair of insulators which sandwich the semiconductor integrated circuit, a thin and small semiconductor device that has resistance properties and high reliability can be provided. Further, shape defects and defective characteristics which are caused by external stress or electrostatic discharge are prevented in the manufacturing process, so that a semiconductor device can be manufactured with high yield.

FIG. 15A illustrates the semiconductor integrated circuit chip 600 sandwiched between a flexible substrate 601 and a flexible substrate 602. The semiconductor integrated circuit chip 600 is provided in a recessed portion provided in the flexible substrate 601.

The recessed portion where the semiconductor integrated circuit chip 600 is provided may be formed in one flexible substrate or both of the flexible substrates. FIG. 15B illustrates an example in which the semiconductor integrated circuit chip 600 is provided in recessed portions provided in both the flexible substrate 601 and the flexible substrate 602.

Alternatively, a flexible substrate may have a three-layer structure and a central flexible substrate may be provided with an opening where the semiconductor integrated circuit chip 600 is provided. FIG. 15C illustrates an example in which an opening is formed in a flexible substrate 603, the semiconductor integrated circuit chip 600 is provided in the opening, and the flexible substrate 603 and the semiconductor integrated circuit chip 600 are sandwiched between the flexible substrate 601 and the flexible substrate 602.

In FIGS. 15A to 15C, a flexible substrate may be stacked on the external side of the flexible substrate 601 and/or the flexible substrate 602.

For each of the flexible substrates 601, 602, and 603, a woven fabric which is woven using bundles of fibers (single yarns) (hereinafter the bundles of fibers are referred to as yarn bundles) for warp yarns and weft yarns, a nonwoven fabric obtained by stacking yarn bundles of plural kinds of fibers randomly or in one direction, paper, or the like can be used. Specifically, the following can be used: a substrate formed from a polyethylene terephthalate (PET) resin, a polyethylene naphthalate (PEN) resin, a polyethersulfone (PES) resin, a polypropylene resin, a polypropylene sulfide resin, a polycarbonate resin, a polyetherimide resin, a polyphenylene sulfide resin, a polyphenylene oxide resin, a polysulfone resin, a polyphthalamide resin, or the like; a substrate formed from a polypropylene resin, a polyester resin, a vinyl resin, a polyvinyl fluoride resin, a vinyl chloride resin, a polyamide resin, or the like; a film; paper formed from a fibrous material; and the like. Further, a layered film of an adhesive synthetic resin film (formed of an acrylic synthetic resin, an epoxy synthetic resin, or the like) can be used. A bonding layer may be used to bond a substrate or a film to a subject to be processed. A condition can be selected in accordance with the kind of the substrate or the film, and bonding can be performed by heat treatment or application of pressure. The bonding layer corresponds to a layer containing an adhesive such as a thermosetting resin, an ultraviolet curable resin, an epoxy resin adhesive, or a resin additive.

As in this embodiment, when the semiconductor integrated circuit chip 600 is provided so as to be embedded in the recessed portion or the opening provided in the flexible substrate on which the semiconductor integrated circuit chip is mounted, a projected portion due to the provision of the semiconductor integrated circuit chip 600 is not formed; therefore, the surface of the flexible substrate is flat, and the film thickness can be uniform. Accordingly, even if pressure treatment is performed with a roller or the like for attachment when the semiconductor integrated circuit chip is mounted on the flexible substrate, pressure can be prevented from being locally applied on the semiconductor integrated circuit chip (i.e., pressure concentration can be prevented). Thus, damage to the semiconductor integrated circuit chip can be reduced in a mounting step, whereby the yield of a semiconductor device is improved. Moreover, even after mounting, a highly reliable semiconductor device that has high resistance to external stress can be obtained.

In addition, since the semiconductor device can have a flat and smooth surface, it has excellent properties of stacking and transportation when the semiconductor device is stored and set on a machine. Further, the semiconductor integrated circuit chip is not visually identified from the outside (i.e., a projected portion that reflects the shape of the semiconductor integrated circuit chip is not generated on the surface); therefore, a semiconductor device with high security can be formed.

[Embodiment 9]

A conductive shield preferably has a certain degree of conductivity in order to protect a semiconductor integrated circuit from electrostatic discharge, and adverse effects on the communication range should be considered because the conductive shield absorbs electric waves sent and received through an antenna.

Figure 19:
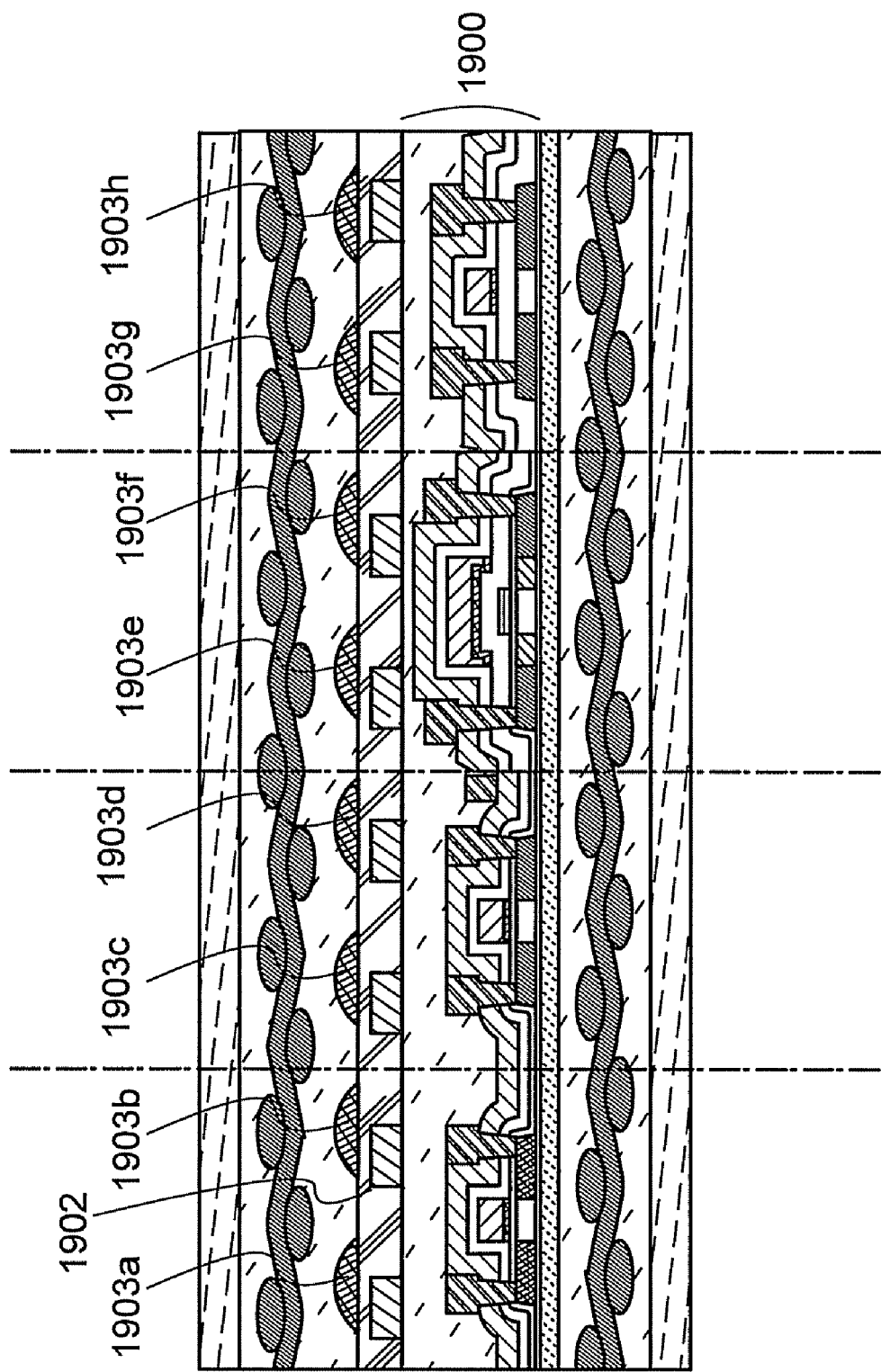
FIG. 19 illustrates a method for manufacturing a semiconductor device in one embodiment of the present invention.

When a conductive shield is provided over a semiconductor integrated circuit 1900 and an antenna 1902 with an insulating layer therebetween as illustrated in FIG. 19, island-shaped conductors may be scattered over the insulating layer as illustrated as conductors 1903a to 1903h. At this time, although each of the conductors 1903a to 1903h is an island-shaped conductor formed from a conductive material and has conductivity in the longitudinal direction, the conductors are not connected to each other. Accordingly, conduction is not made in the lateral direction, for example, between the conductors 1903a and 1903b and between the conductors 1903a and 1903c.

With such a structure, the conductive shield can favorably protect the semiconductor integrated circuit 1900 from electrostatic discharge, and does not have conductivity in the longitudinal direction. Accordingly, interference of electric waves sent and received through the antenna can be minimized.

EXAMPLE 1

In this example, semiconductor devices which are one embodiment of the present invention were manufactured, and the results of evaluating the reliability of the semiconductor devices will be shown.

A sample was manufactured as follows: a layered structure in which a semiconductor integrated circuit is sandwiched between a first insulator and a second insulator was formed, and the layered structure was covered with (surrounded by) a conductive shield. In the sample, a prepreg (thickness: 20 μm) which is a structure body in which a fibrous body (glass fiber) is impregnated with an organic resin (a brominated epoxy resin) was used as the first insulator and the second insulator. A sample in which the conductive shield was formed of a 10-nm-thick titanium film was Embodiment A; a sample in which the conductive shield was formed of a compound of silicon oxide and indium tin oxide (hereinafter referred to as ITSO) with a thickness of 10 nm was Embodiment B; a sample in which the conductive shield was formed of ITSO with a thickness of 100 nm was Embodiment C; and a sample in which the conductive shield was not provided was Comparative Example D. Evaluation of electrostatic discharge (ESD) resistance was performed on those samples to measure the reliability.

In the evaluation of ESD resistance, the sample was placed on a stack of a glass substrate (thickness: 0.5 mm), an aluminum plate, and a conductive sheet; a voltage was applied with an ESD tester (simple response evaluation, manufactured by TAKAYA Corporation) from the side of the sample, where the conductive shield was formed, to the central part of the integrated circuit; electricity was removed (for one minute) after ESD was applied; and operation check was performed. Note that the operation check was performed under such a condition that a surface on the side where the antenna was provided with respect to the semiconductor integrated circuit was regarded as a "top surface" and a surface on the side opposite to the side where the antenna was provided with respect to the semiconductor integrated circuit was regarded as a "bottom surface".

The ESD measurement was performed on five Embodiments A, four Embodiments B, four Embodiments C, and four Comparative Example D. Table 1 shows average values, maximum values, and minimum values of ESD applied voltage [kV] until the samples entered into a non-operation state.

TABLE 1

| Sample | | ESD applied voltage [kV] until sample entered into a non-operation state | | |
|---|---|---|---|---|
| | | Maximum | Average | Minimum |
| Embodiment A | Bottom | 15.0 | 15.0 | 15.0 |
| | Top | 15.0 | 15.0 | 15.0 |
| Embodiment B | Bottom | 13.0 | 12.0 | 11.0 |
| | Top | 15.0 | 14.0 | 9.0 |
| Embodiment C | Bottom | 15.0 | 15.0 | 15.0 |
| | Top | 15.0 | 15.0 | 15.0 |

TABLE 1-continued

| Sample | | ESD applied voltage [kV] until sample entered into a non-operation state | | |
|---|---|---|---|---|
| | | Maximum | Average | Minimum |
| Comparative Example D | Bottom | 7.0 | 2.7 | 2.0 |
| | Top | 6.0 | 5.2 | 4.0 |

The average value, the maximum value, and the minimum value of the ESD applied voltage [kV] until Comparative Example D entered into a non-operation state on the bottom surface side were 2.7 kV, 7.0 kV, and 2.0 kV, respectively. On the other hand, the average value, the maximum value, and the minimum value of Embodiment A on the bottom surface side were 15.0 kV, 15.0 kV, and 15.0 kV, respectively; the average value, the maximum value, and the minimum value of Embodiment B were 12.0 kV, 13.0 kV, and 11.0 kV, respectively; and the average value, the maximum value, and the minimum value of Embodiment C were 15.0 kV, 15.0 kV, and 15.0 kV, respectively. It is found that Embodiment A and Embodiment C each including the conductive shield was able to operate at higher voltage. The above results confirmed that when the semiconductor integrated circuit was covered with the conductive shield, resistance to electrostatic discharge was increased, and thus electrostatic breakdown hardly occurred.

The above results confirmed that when one embodiment of the present invention was used, the conductive shield covering the semiconductor integrated circuit was able to prevent electrostatic breakdown (malfunction of the circuit or damage to a semiconductor element) of the semiconductor integrated circuit due to electrostatic discharge, and a thin and small semiconductor device that has resistance properties and high reliability was able to be provided.

EXAMPLE 2

Next, results of the bending test on semiconductor devices which are one embodiment of the present invention will be described.

First, five Embodiments E having the same structure as Embodiment A, five Embodiments F having the same structure as Embodiment B, and five Comparative Examples G having the same structure as Comparative Example D were prepared. Then, five samples were arranged on a polyethylene naphthalate tape, and the polyethylene naphthalate tape provided with a weight of 670 g on one side was moved back and forth on a metal rod around which paper was wound.

Response evaluation was performed on each of the five samples of Embodiment E, Embodiment F, and Comparative Example G every 30 round trips. Tables 2, 3, and 4 show the results of the response evaluation of Comparative Example G, Embodiment E, and Embodiment F until 300 round trips, respectively.

TABLE 2

| | Before Test | | Number of Times of Round Trips for Bending Test | | | | | | | | | | After Test | | |
|---|---|---|---|---|---|---|---|---|---|---|---|---|---|---|---|
| No. | Resonance Frequency (MHz) | Maximum Communication Range (mm) | 30 | 60 | 90 | 120 | 150 | 180 | 210 | 240 | 270 | 300 | After Division | Resonance Frequency (MHz) | Maximum Communication Range (mm) |
| 1 | 15.9 | 22 | ○ | x | x | x | x | x | x | x | x | x | x | 15.7 | x |
| 2 | 15.2 | 18 | ○ | x | x | x | x | x | x | x | x | x | x | 14.8 | x |
| 3 | 15.1 | 20 | ○ | x | x | x | x | x | x | x | x | x | x | 15.7 | x |

TABLE 2-continued

| | Before Test | | | | | | | | | | | | After Test | |
|---|---|---|---|---|---|---|---|---|---|---|---|---|---|---|
| | Resonance Frequency | Maximum Communication | Number of Times of Round Trips for Bending Test | | | | | | | | | After | Resonance Frequency | Maximum Communication |
| No. | (MHz) | Range (mm) | 30 | 60 | 90 | 120 | 150 | 180 | 210 | 240 | 270 | 300 | Division | (MHz) | Range (mm) |
| 4 | 16.0 | 18 | x | x | x | x | x | x | x | x | x | x | x | 14.8 | x |
| 5 | 15.9 | 19 | x | x | x | x | x | x | x | x | x | x | x | 16.4 | x |

TABLE 3

| | Before Test | | | | | | | | | | | | After Test | |
|---|---|---|---|---|---|---|---|---|---|---|---|---|---|---|
| | Resonance Frequency | Maximum Communication | Number of Times of Round Trips for Bending Test | | | | | | | | | After | Resonance Frequency | Maximum Communication |
| No. | (MHz) | Range (mm) | 30 | 60 | 90 | 120 | 150 | 180 | 210 | 240 | 270 | 300 | Division | (MHz) | Range (mm) |
| 1 | 12.9 | 19 | ○ | ○ | ○ | ○ | ○ | ○ | ○ | ○ | ○ | ○ | ○ | 12.9 | 20 |
| 2 | 13.0 | 19 | ○ | ○ | ○ | ○ | ○ | ○ | ○ | ○ | ○ | ○ | ○ | 13.0 | 19 |
| 3 | 13.0 | 15 | ○ | ○ | ○ | ○ | ○ | ○ | ○ | ○ | ○ | ○ | ○ | 13.1 | 15 |
| 4 | 13.0 | 19 | ○ | ○ | ○ | ○ | ○ | ○ | ○ | ○ | ○ | ○ | ○ | 13.0 | 19 |
| 5 | 13.0 | 20 | ○ | ○ | ○ | ○ | ○ | ○ | ○ | ○ | ○ | ○ | ○ | 13.0 | 20 |

TABLE 4

| | Before Test | | | | | | | | | | | | After Test | |
|---|---|---|---|---|---|---|---|---|---|---|---|---|---|---|
| | Resonance Frequency | Maximum Communication | Number of Times of Round Trips for Bending Test | | | | | | | | | After | Resonance Frequency | Maximum Communication |
| No. | (MHz) | Range (mm) | 30 | 60 | 90 | 120 | 150 | 180 | 210 | 240 | 270 | 300 | Division | (MHz) | Range (mm) |
| 1 | 13.6 | 18 | ○ | ○ | ○ | ○ | ○ | ○ | ○ | ○ | ○ | ○ | ○ | 13.9 | 18 |
| 2 | 13.7 | 19 | ○ | ○ | ○ | ○ | ○ | ○ | ○ | ○ | ○ | ○ | ○ | 13.9 | 17 |
| 3 | 13.9 | 16 | ○ | ○ | ○ | ○ | ○ | ○ | ○ | ○ | ○ | ○ | ○ | 13.8 | 16 |
| 4 | 13.9 | 18 | ○ | ○ | ○ | ○ | ○ | ○ | ○ | ○ | ○ | ○ | ○ | 13.9 | 18 |
| 5 | 14.0 | 14 | ○ | ○ | ○ | ○ | ○ | ○ | ○ | ○ | ○ | ○ | ○ | 13.9 | 15 |

It is found that three of the five samples of Comparative Example G showed response until 30 round trips and did not respond afterwards. Moreover, it is found that all five samples of each of Embodiment E and Embodiment F showed response until 300 round trips.

The above results confirmed that when one embodiment of the present invention was used, the conductive shield covering the semiconductor integrated circuit was able to prevent electrostatic breakdown (malfunction of the circuit or damage to a semiconductor element) of the semiconductor integrated circuit due to electrostatic discharge, and an insulator covering the semiconductor integrated circuit was able to improve the reliability against bending stress. The above results also confirmed that a thin and small semiconductor device that has resistance properties and high reliability was able to be provided.

EXAMPLE 3

In this example, semiconductor devices which are one embodiment of the present invention were manufactured, and the results of evaluating the reliability of the semiconductor devices will be shown.

As samples, layered structures (Embodiment H, Embodiment I, and Embodiment J) of a conductive shield, a fourth insulator, a first insulator, an antenna, a semiconductor integrated circuit, a third insulator, a second insulator, and a conductive shield were manufactured. In the sample, a prepreg (thickness: 20 μm) in which a fibrous body (glass fiber) was impregnated with an organic resin (a brominated epoxy resin) was used as the first insulator and the second insulator. An aramid film (thickness: 12 μm) was used as the third insulator and the fourth insulator. Note that a silicon nitride film was formed over the antenna as a protective layer, and an acrylic resin (thickness: 10 μm) was formed as a bonding layer between the third insulator and the semiconductor integrated circuit.

The conductive shield was formed of a titanium film in Embodiment H, an ITSO film in Embodiment I, and a nickel film in Embodiment J. In the structure of each sample, in the case where the conductive shield was formed of the titanium film or the ITSO film, the thickness of the conductive shield was 5 nm, 10 nm, 50 nm, and 100 nm. Moreover, in the case where the conductive shield was formed of the nickel film, the thickness of the conductive shield was 10 nm, 50 nm, and 100 nm. Note that a conductive shield with a thickness of 0 nm was a sample in which a conductive shield was not formed, which is Comparative Example.

ESD measurement (five samples for each thickness), bending test (five samples for each thickness), and measurement of sheet resistance (five samples for each thickness) were performed on Embodiment H, Embodiment I, and Embodiment J.

The ESD measurement was performed by a similar method to Example 1. The bending test was performed by a similar method to Example 2. The sheet resistance was measured in such a manner that each of a titanium film, an ITSO film, and a nickel film was formed over glass. The thickness of the titanium film and the ITSO film was 5 nm, 10 nm, 50 nm, and 100 nm, and the thickness of the nickel film was 10 nm, 50 nm, and 100 nm. Each sample was measured with a resistivity tester (manufactured by NPS, INC.) by a DC four-probe method.

Figure 16:
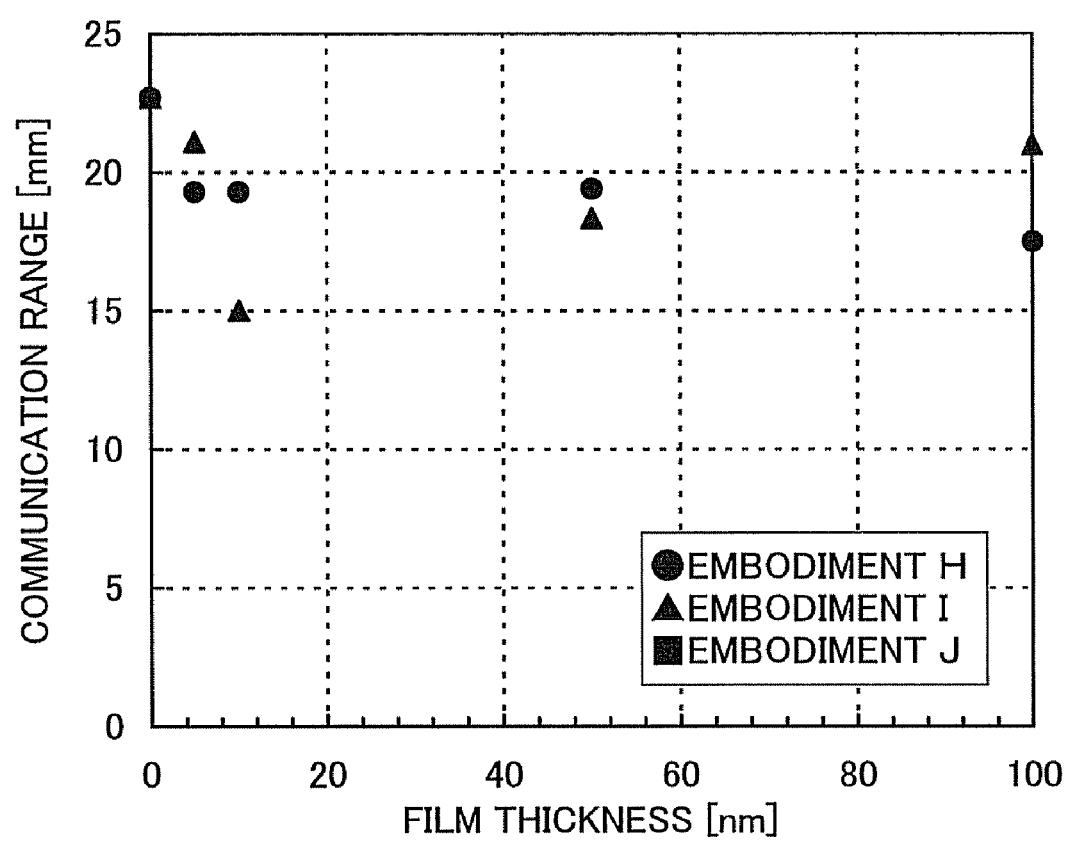
FIG. 16 illustrates an evaluation result (a communication range) of a semiconductor device in one embodiment of the present invention in Example 3.
Figure 17:
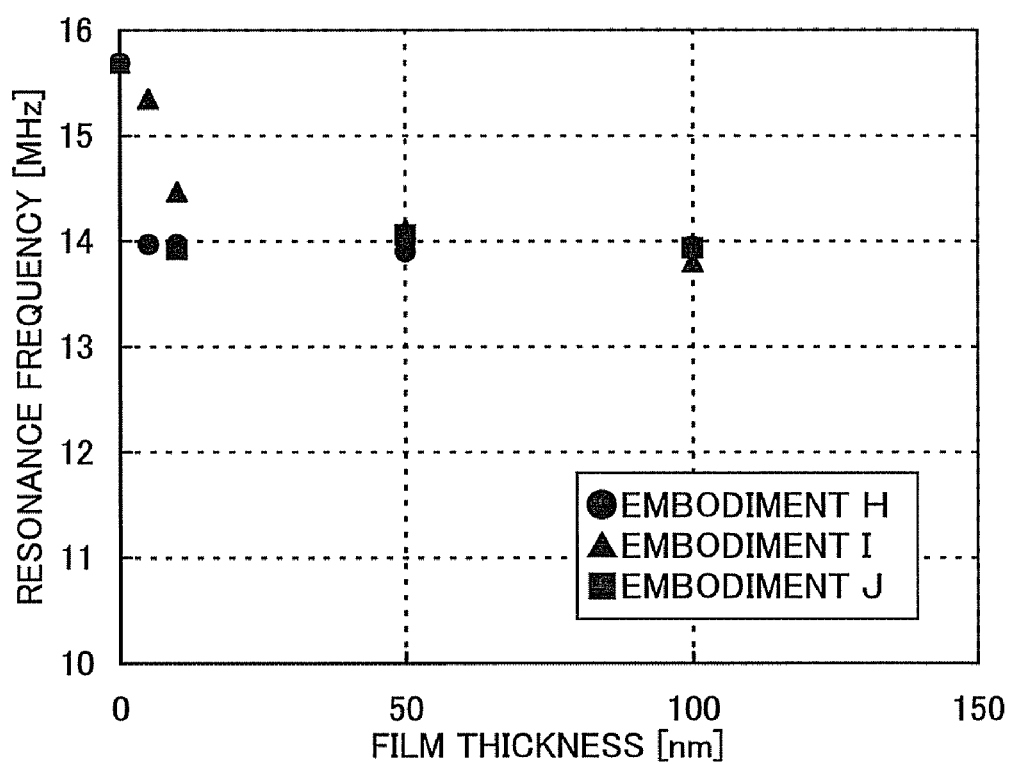
FIG. 17 illustrates an evaluation result (a resonance frequency) of a semiconductor device in one embodiment of the present invention in Example 3.

FIG. 16 shows the results of the communication range of Embodiment H and Embodiment I. FIG. 17 shows the results of the resonance frequency of Embodiment H, Embodiment I, and Embodiment J. FIG. 16 and FIG. 17 each show results of average values obtained after ten samples with each thickness were measured. The results of FIG. 16 showed that the communication ranges of Embodiment H and Embodiment I were hardly changed depending on the material or the thickness of the conductive shield. Further, the results of FIG. 17 showed that the resonance frequencies of Embodiment H, Embodiment I, and Embodiment J were hardly changed depending on the material or the thickness of the conductive shield. In other words, electromagnetic waves were transmitted through the conductive shield, so that communication with the outside was able to be favorably performed.

Figure 18:
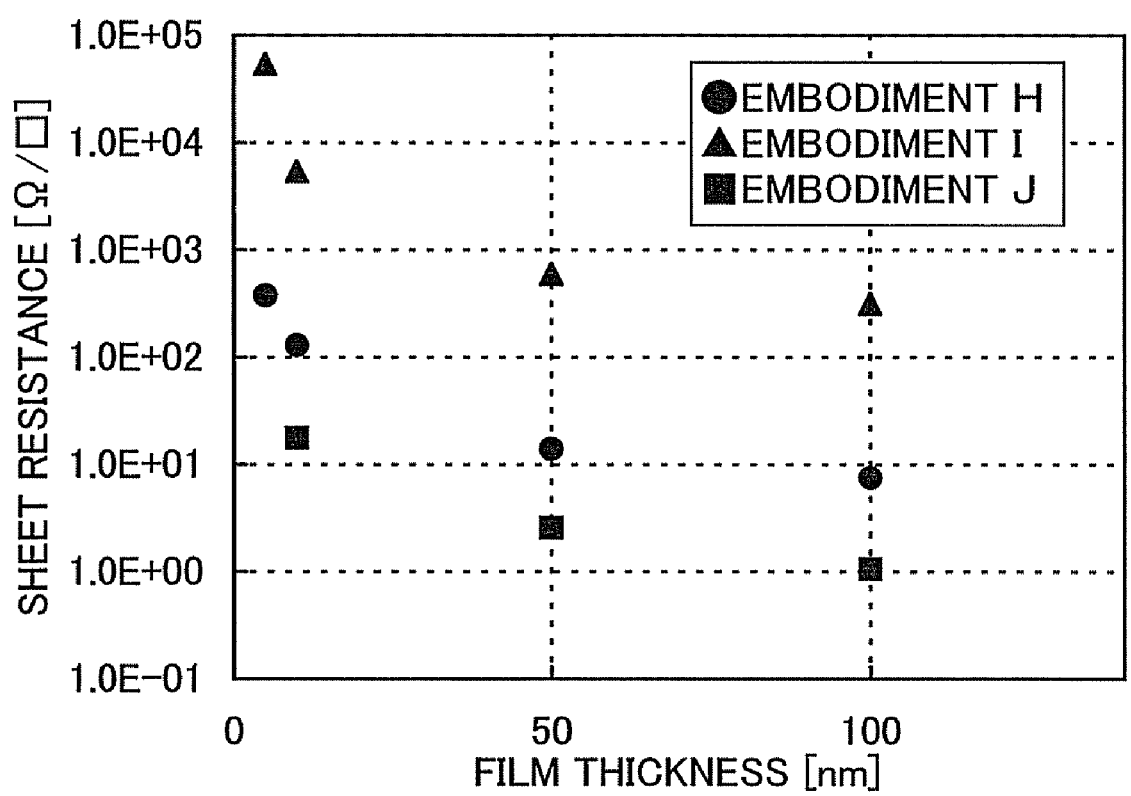
FIG. 18 illustrates an evaluation result (measurement of the resistivity of a conductive shield) of a semiconductor device in one embodiment of the present invention in Example 3.

FIG. 18 shows the measurement results of the resistivity of Embodiment H, Embodiment I, and Embodiment J. The sheet resistance of Embodiment H, Embodiment I, and Embodiment J tended to decrease as the thickness of the conductive shield was increased. The above results showed that in Embodiment H, Embodiment I, and Embodiment J, increase in the thickness of the conductive shield made the sheet resistance decreased and made it possible to effectively diffuse static electricity if electrostatic discharge occurred. Further, it was found that the thickness of the conductive shield and the sheet resistance were correlated with each other, and the sheet resistance was able to be controlled by the thickness of the conductive shield.

Next, Tables 5, 6, and 7 show the results of the ESD measurement of Embodiment H, Embodiment I, and Embodiment J, respectively. The measurement was performed on five samples of each Embodiment with each thickness. In Tables 5 to 7, the denominator of the measurement result indicates the number of test samples and the numerator thereof indicates the number of samples that operated.

TABLE 5

| | Result of ESD Application Test | | | | | | | | | |
|---|---|---|---|---|---|---|---|---|---|---|
| ESD applied voltage | When ESD is applied from antenna side | | | | | When ESD is applied from semiconductor integrated circuit side | | | | |
| | Thickness of Embodiment H [nm] | | | | | | | | | |
| [kV] | 0 | 5 | 10 | 50 | 100 | 0 | 5 | 10 | 50 | 100 |
| 5 kV | 1/5 | 5/5 | 5/5 | 5/5 | 5/5 | 0/5 | 5/5 | 5/5 | 5/5 | 5/5 |
| 10 kV | 0/5 | 5/5 | 5/5 | 5/5 | 5/5 | 0/5 | 5/5 | 5/5 | 5/5 | 5/5 |
| 15 kV | 0/5 | 5/5 | 5/5 | 5/5 | 5/5 | 0/5 | 3/5 | 5/5 | 5/5 | 5/5 |

TABLE 6

| | Result of ESD Application Test | | | | | | | | | |
|---|---|---|---|---|---|---|---|---|---|---|
| ESD applied voltage | When ESD is applied from antenna side | | | | | When ESD is applied from semiconductor integrated circuit side | | | | |
| | Thickness of Embodiment I [nm] | | | | | | | | | |
| [kV] | 0 | 5 | 10 | 50 | 100 | 0 | 5 | 10 | 50 | 100 |
| 5 kV | 1/5 | 5/5 | 5/5 | 5/5 | 5/5 | 0/5 | 5/5 | 5/5 | 5/5 | 5/5 |
| 10 kV | 0/5 | 5/5 | 5/5 | 5/5 | 5/5 | 0/5 | 5/5 | 5/5 | 5/5 | 5/5 |
| 15 kV | 0/5 | 4/5 | 4/5 | 5/5 | 5/5 | 0/5 | 4/5 | 4/5 | 4/5 | 5/5 |

TABLE 7

| | Result of ESD Application Test | | | | | | | |
|---|---|---|---|---|---|---|---|---|
| ESD applied voltage | When ESD is applied from antenna side | | | | When ESD is applied from semiconductor integrated circuit side | | | |
| | Thickness of Embodiment J [nm] | | | | | | | |
| [kV] | 0 | 10 | 50 | 100 | 0 | 10 | 50 | 100 |
| 5 kV | 1/5 | 5/5 | 5/5 | 5/5 | 1/5 | 5/5 | 5/5 | 5/5 |
| 10 kV | 0/5 | 5/5 | 5/5 | 5/5 | 0/5 | 5/5 | 5/5 | 5/5 |
| 15 kV | 0/5 | 5/5 | 5/5 | 5/5 | 0/5 | 5/5 | 5/5 | 5/5 |

As for Comparative Example in which a conductive shield was not provided, only one of five samples operated in the case where a voltage of 5 kV was applied, and none of them operated in the case where a voltage of 10 kV was applied. As for Embodiment H, three of five samples including the 5-nm-thick conductive shield operated in the case where a voltage of 15 kV was applied from the bottom surface, and all of them including the conductive shield with a thickness other than 5 nm operated in the case where a voltage of 15 kV was applied from the top surface or the bottom surface. Moreover, as for Embodiment I, all of five samples including the conductive shield with a thickness of 50 nm or 100 nm operated in the case where a voltage of 15 kV was applied, and four of five samples including the conductive shield with a thickness of 5 nm or 10 nm operated in the case where a voltage of 15 kV was applied. As for Embodiment J, five samples all operated regardless of the thickness of the conductive shield and voltage. The above results showed that increase in the thickness of the conductive shield made it possible to prevent electrostatic breakdown due to electrostatic discharge.

Next, Table 8 shows the results of the bending test of Embodiment H, Embodiment I, and Embodiment J. In Table 8, the term "judgment" indicates whether the sample operated normally after bending test was performed 300 times. The denominator of the judgment result indicates the number of test samples, and the numerator thereof indicates the number of samples that operated. The measurement was performed on five samples of each Embodiment with each thickness.

TABLE 8

| | | Thickness of Sample [nm] | | | | |
|---|---|---|---|---|---|---|
| | Sample | 0 | 5 | 10 | 50 | 100 |
| Judgment | Embodiment H | 0/5 | 5/5 | 5/5 | 5/5 | 5/5 |
| | Embodiment I | 0/5 | 5/5 | 5/5 | 5/5 | 5/5 |
| | Embodiment J | — | — | 5/5 | 5/5 | 5/5 |

As for Comparative Example in which a conductive shield was not formed, none of five samples did not show response after 300 round trips. On the other hand, as for each of Embodiment H, Embodiment I, and Embodiment J, all five samples with each thickness showed response after 300 round trips. The above results showed that by covering the integrated circuit with the conductive shield, electrostatic breakdown due to electrostatic discharge was able to be prevented.

The above results confirmed that when one embodiment of the present invention was used, the conductive shield covering the semiconductor integrated circuit was able to prevent electrostatic breakdown (malfunction of the circuit or damage to a semiconductor element) of the semiconductor integrated circuit due to electrostatic discharge, and a thin and small semiconductor device that has resistance properties and high reliability was able to be provided.

This application is based on Japanese Patent Application serial No. 2008-246052 filed with Japan Patent Office on Sep. 25, 2008, the entire contents of which are hereby incorporated by reference.

[Explanation of Reference]
100: semiconductor integrated circuit, 101: antenna, 102: second insulator, 103: fourth insulator, 105: contact hole, 110: substrate, 111, separation layer, 112: first insulator, 113: third insulator, 140: conductive shield, 150: fibrous body, 151: organic resin, 160: fibrous body, 161: organic resin, 190: chip, 191: chip, 193: chip, 194: chip, 195: chip, 196: chip, 197: chip, 200: substrate, 201: separation layer, 206: channel formation region, 207: gate insulating layer, 208: gate electrode layer, 210: transistor, 211: transistor, 212: insulating film, 213: insulating film, 241: insulating layer, 226: channel formation region, 227: gate insulating layer, 228: gate electrode layer, 250: semiconductor integrated circuit, 252: second insulator, 254: inorganic insulating layer, 260: conductive shield, 262: first insulator, 263: conductive layer, 270: fibrous body, 271: organic resin, 280: fibrous body, 281: organic resin, 300: substrate, 301: separation layer, 302: insulating film, 303: semiconductor layer, 304: semiconductor layer, 305: semiconductor layer, 306: semiconductor layer, 308: gate insulating layer, 309: gate insulating layer, 310: insulating film, 311: charge accumulation layer, 312: first gate electrode layer, 313: first gate electrode layer, 314: first gate electrode layer, 315: first control gate electrode layer, 316: second gate electrode layer, 317: second gate electrode layer, 318: second gate electrode layer, 319: second control gate electrode layer, 320: impurity element, 321: mask, 323: channel formation region, 324: impurity element, 325: mask, 329: channel formation region, 330: channel formation region, 331: channel formation region, 350: semiconductor integrated circuit, 363: mask, 367: insulating film, 368: insulating film, 373: thin film transistor, 374: thin film transistor, 375: memory element, 376: thin film transistor, 380: conductive layer, 381: inorganic insulating layer, 382: first insulator, 383: fibrous body, 384: organic resin, 385: second insulator, 388: third insulator, 389: bonding layer, 390: insulating layer, 391: fourth insulator, 395: conductive shield, 400: semiconductor integrated circuit chip, 405: antenna, 406: support substrate, 500: microprocessor, 501: arithmetic logic unit, 502: ALU controller, 503: instruction decoder, 504: interrupt controller, 505: timing controller, 506: register, 507: register controller, 508: bus interface, 509: read only memory, 510: memory interface, 511: RFCPU, 512: analog circuit portion, 513: digital circuit portion, 514: resonance circuit, 515: rectifier circuit, 516: constant voltage circuit, 517: reset circuit, 518: oscillator circuit, 519: demodulation circuit, 520: modulation circuit, 521: RF interface, 522: control register, 523: clock controller, 524: CPU interface, 525: central processing unit, 526: random access memory, 527: read only memory, 528: antenna, 529: capacitor portion, 530: power supply control circuit, 600: semiconductor integrated circuit chip, 601: flexible substrate, 602: flexible substrate, 603: flexible substrate, 800: semiconductor device, 810: high frequency circuit, 820: power supply circuit, 830: reset circuit, 840: clock generator circuit, 850: data demodulation circuit, 860: data modulation circuit, 870: control circuit, 880: memory circuit, 890: antenna, 910: code extracting circuit, 920: code judging circuit, 930: CRC judging circuit, 940: output unit circuit, 1900: semiconductor integrated circuit, 1902: antenna, 3200: communication device, 3210: display portion, 3220: product, 3230: semiconductor device, 3240: communication device, 3250: semiconductor device, 3260: product, 140a: conductive shield, 140b: conductive shield, 204a: source/drain region, 204b: source/drain region, 224a: source/drain region, 224b: source/drain region, 203a: impurity region, 203b: impurity region, 223a: impurity region, 223b: impurity region, 209a: insulating layer having sidewall structure, 209b: insulating layer having sidewall structure, 210a: wiring layer, 210b: wiring layer, 229a: insulating layer having sidewall structure, 229b: insulating layer having sidewall structure, 230a: wiring layer: 230b: wiring layer, 322a: p-type impurity region, 322b: p-type impurity region, 326a: n-type impurity region, 326b: n-type impurity region, 327a: n-type impurity region, 327b: n-type impurity region, 328a: n-type impurity region, 328b: n-type impurity region, 362a: n-type impurity region, 362b: n-type impurity region, 364a: n-type impurity region, 364b: n-type impurity region, 369a: wiring layer, 369b: wiring layer, 370a: wiring layer, 370b: wiring layer, 371a: wiring layer, 371b: wiring layer, 372a: wiring layer, 372b: wiring layer, 1903a: conductor, 1903b: conductor, 1903c: conductor, 1903d: conductor, 1903e: conductor, 1903f: conductor, 1903g: conductor, 1903h: conductor

The invention claimed is:

1. A semiconductor device comprising:
a first insulator and a second insulator provided so as to face each other;
a semiconductor integrated circuit sandwiched between the first insulator and the second insulator;
a conductive film provided so as to cover the first insulator and the second insulator; and
an antenna provided over the conductive film, the antenna being electrically connected to the semiconductor integrated circuit with the conductive film and the first insulator therebetween.

2. A semiconductor device comprising:
a first insulator and a second insulator provided so as to face each other;
a semiconductor integrated circuit sandwiched between the first insulator and the second insulator;
a conductive film provided so as to cover the first insulator and the second insulator, wherein the conductive film covering a side surface of the first insulator or the second insulator is thicker than that covering a top surface of the first insulator or the second insulator; and
an antenna provided over the conductive film, the antenna being electrically connected to the semiconductor integrated circuit with the conductive film and the first insulator therebetween.

3. The semiconductor device according to any one of claims 1 to 2, wherein the antenna and the conductive film are formed in contact with each other.

4. The semiconductor device according to any one of claims 1 to 2, further comprising an insulating layer interposed between the antenna and the conductive film.

5. The semiconductor device according to any one of claims 1 to 2, wherein each of the first insulator and the second insulator has a structure in which a fibrous body is impregnated with an organic resin.

6. The semiconductor device according to any one of claims 1 to 2, wherein the conductive film includes a metal film.

7. The semiconductor device according to claim 6, wherein the metal film is a titanium film with a thickness of greater than or equal to 5 nm and less than or equal to 100 nm.

8. The semiconductor device according to any one of claims 1 to 2, wherein the conductive film includes a metal oxide film.

9. The semiconductor device according to claim 8, wherein the metal oxide film is an indium tin oxide film or an indium tin oxide film containing silicon oxide with a thickness of greater than or equal to 5 nm and less than or equal to 100 nm.

10. The semiconductor device according to any one of claims 1 to 2, wherein the conductive film includes a semiconductor film or a metal nitride film.

11. The semiconductor device according to any one of claims 1 to 2, wherein the conductive film has a structure in which island-shaped conductors are scattered.

12. The semiconductor device according to any one of claims 1 to 2, wherein the first insulator or the second insulator has a thickness of greater than or equal to 5 µm and less than or equal to 50 µm.

13. The semiconductor device according to any one of claims 1 to 2, wherein the semiconductor device is one selected from the group consisting of a microprocessor, an RFCPU, and an RFID tag.

* * * * *